(12) United States Patent
Kawano

(10) Patent No.: US 11,316,087 B2
(45) Date of Patent: Apr. 26, 2022

(54) LIGHT EMITTING DEVICE

(71) Applicant: NICHIA CORPORATION, Anan (JP)

(72) Inventor: Yusuke Kawano, Anan (JP)

(73) Assignee: NICHIA CORPORATION, Anan (JP)

( * ) Notice: Subject to any disclaimer, the term of this patent is extended or adjusted under 35 U.S.C. 154(b) by 44 days.

(21) Appl. No.: 17/035,698

(22) Filed: Sep. 29, 2020

(65) Prior Publication Data

US 2021/0098671 A1 Apr. 1, 2021

(30) Foreign Application Priority Data

Sep. 30, 2019 (JP) .............................. JP2019-180927

(51) Int. Cl.

| | |
|---|---|
| *H01L 33/62* | (2010.01) |
| *H01L 33/38* | (2010.01) |
| *H01L 33/48* | (2010.01) |
| *H01L 33/10* | (2010.01) |
| *H01L 27/15* | (2006.01) |
| *H05K 1/18* | (2006.01) |
| *H01L 33/36* | (2010.01) |

(52) U.S. Cl.
CPC ............ *H01L 33/62* (2013.01); *H01L 27/156* (2013.01); *H01L 33/10* (2013.01); *H01L 33/36* (2013.01); *H01L 33/387* (2013.01); *H01L 33/486* (2013.01); *H05K 1/181* (2013.01)

(58) Field of Classification Search
CPC ....... H01L 33/36; H01L 33/62; H01L 27/156; H01L 33/10; H01L 33/387; H05K 1/181
See application file for complete search history.

(56) References Cited

U.S. PATENT DOCUMENTS

2017/0150609 A1 5/2017 Miwa et al.
2018/0337315 A1* 11/2018 Yu ....................... H01L 25/0753

FOREIGN PATENT DOCUMENTS

| JP | 2009-059966 | 3/2009 |
| JP | 2017-103443 | 6/2017 |

* cited by examiner

*Primary Examiner* — Feifei Yeung Lopez
(74) *Attorney, Agent, or Firm* — Mori & Ward, LLP

(57) ABSTRACT

A light emitting device includes a mount board that includes a wiring pattern on an upper surface, and light emitting elements that are mounted at corresponding one of mounting positions on the wiring pattern to be connected in series and/or in parallel to each other through the wiring pattern. The light emitting elements each include a pair of electrodes on a back surface side thereof. The mounting positions include four or more connection terminals that are electrically separated from each other to connect the electrodes of their corresponding light emitting element to each other. Series connection and parallel connection numbers are determined in accordance with orientations of the light emitting elements in which each electrode straddles at least adjacent two of the four or more connection terminals that are spaced away from and adjacent to each other.

13 Claims, 21 Drawing Sheets

LIGHT EMITTING DEVICE

CROSS-REFERENCE TO RELATED APPLICATION

The present application claims priority under 35 U.S.C. § 119 to Japanese Patent Application No. 2019-180927, filed on Sep. 30, 2019, the content of which is incorporated herein by reference in their entirety.

BACKGROUND

Field of the Invention

This disclosure relates to a light emitting device.

Discussion of the Background

A light emitting device includes a plurality of LEDs which are connected in series or parallel to each other on a predetermined wiring pattern (e.g., JP 2009-59,966 and JP 2017-103,443).

In such a light emitting device described in JP 2009-59,966 or JP 2017-103,443, the number of LEDs that are connected in series or parallel is required to be changed in accordance with its specifications such as required light amount or drive voltage. Because its wiring pattern cannot accept change in the number of LEDs that are connected in series or parallel, the wiring pattern is necessarily redesigned to a new wiring pattern depending on the requirements.

Therefore, embodiments of the present disclosure advantageously provide a light emitting device capable of changing the number of light emitting elements that are connected in series or parallel by using a common wiring pattern.

SUMMARY

A light emitting device according to one aspect of the present disclosure includes a mount board and a plurality of light emitting elements. The mount board includes a wiring pattern on an upper surface. The plurality of light emitting elements are mounted at corresponding one of mounting positions on the wiring pattern to be connected in series and/or in parallel to each other through the wiring pattern. The plurality of light emitting elements include a pair of electrodes on a back surface side. The plurality of mounting positions include four or more connection terminals that are electrically separated from each other to connect the electrodes of a corresponding light emitting element to each other. A number of the light emitting elements that are connected in series to each other and a number of the light emitting elements that are connected in parallel to each other are determined in accordance with orientations of the light emitting elements, which are mounted at a corresponding mounting position, in which each electrode straddles at least adjacent two of the four or more connection terminals that are spaced away from and adjacent to each other.

According to a light emitting device of one aspect of the present invention, the light emitting device can change the number of light emitting elements that are connected in series or parallel by using a common wiring pattern.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
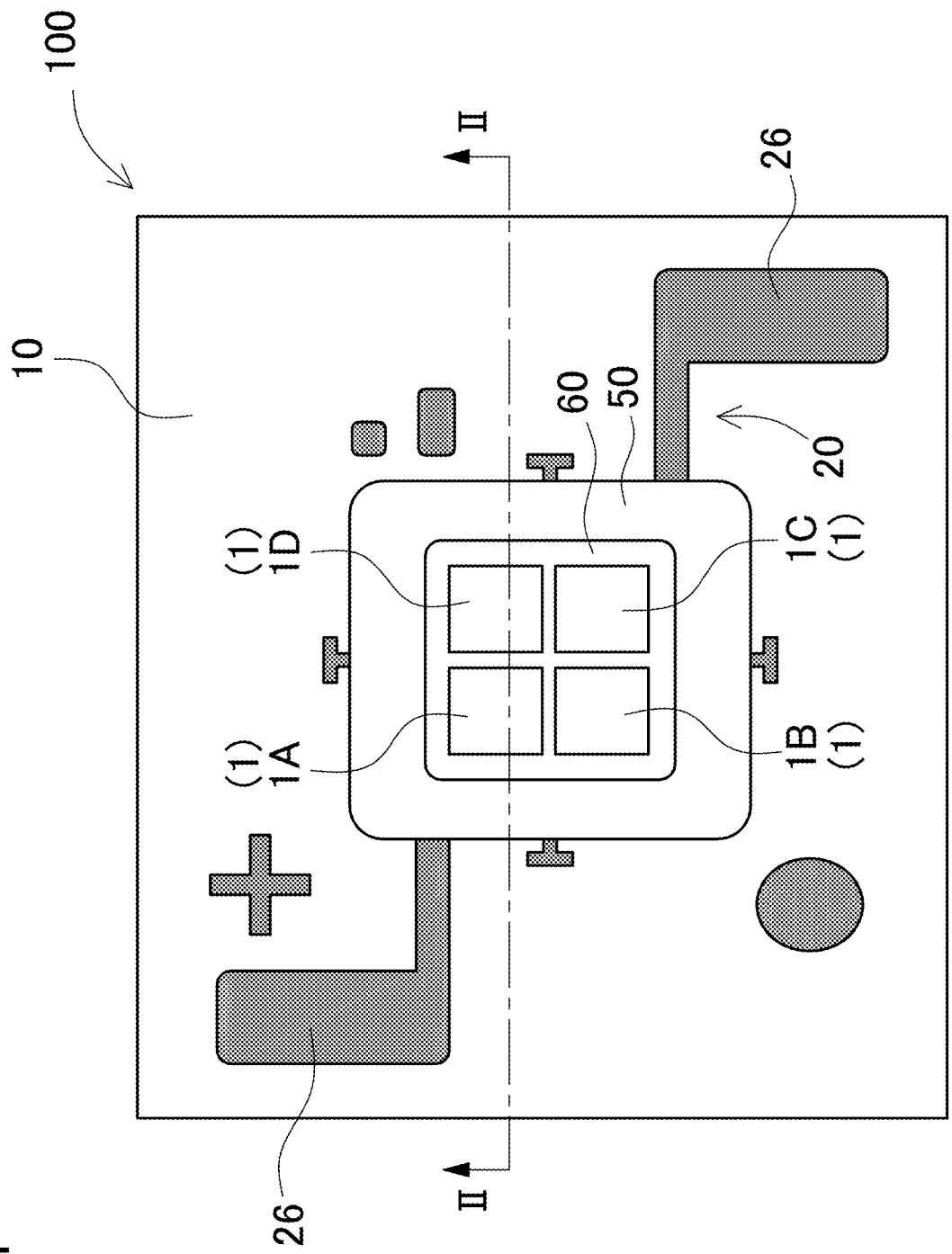
FIG. 1 is a plan view showing a light emitting device according to a first embodiment.

Embodiments of the present disclosure can have the following features.

In a light emitting device according to an embodiment of the present invention, at least one of the four or more connection terminals which are included in one of the mounting positions that are adjacent to each other is electrically connected to at least one of the four or more connection terminals which are included in another adjacent mounting position in the wiring pattern. According to this construction, mounting positions adjacent to each other can be electrically connected to each other by electrical connection between their connection terminals so that electrical conduction in the wiring pattern is surely provided when the light emitting elements are mounted at the mounting positions.

In a light emitting device according to another embodiment of the present invention, in addition to the aforementioned embodiment, an extended part is arranged between the mounting positions that are adjacent to each other in the wiring pattern to connect the connection terminal that is included in one adjacent mounting position to the connection terminal that is included in another adjacent mounting position.

In addition to this, the extended part has a width smaller than the connection terminal. According to this construction, the narrow extended part can facilitate self-alignment when the light emitting elements are mounted by eutectic bonding. Also, light absorption by the mounting pattern can be reduced.

Also, in a light emitting device according to another embodiment of the present invention, in addition to any of the aforementioned embodiment, the pair of electrodes have an elongated shape which extends one direction.

In addition to this, the plurality of light emitting elements are connected in series and in parallel to each other by each electrode in the pair which electrically connects the at least adjacent two connection terminals to each other when the light emitting elements are mounted at the mounting positions. According to this construction, because the connection terminals can be connected to each other by the electrodes of the light emitting elements so that electrical conduction in the wiring pattern is provided, connection in the wiring can be conducted by the electrodes of the light emitting elements without using other members such as wire.

Also, in a light emitting device according to another embodiment of the present invention, in addition to any of the aforementioned embodiment, the number of the light emitting elements that are connected in series to each other and the number of the light emitting elements that are connected in parallel to each other are changed in accordance with orientations which are changed from one to another by rotating the light emitting elements 90°.

Also, in a light emitting device according to another embodiment of the present invention, in addition to any of the aforementioned embodiment, the light emitting elements have a substantially square shape.

In addition, the pair of electrodes extend along two opposed sides of the square shape.

In addition, the mounting positions have a substantially square shape corresponding the square shape of the light emitting element.

In addition, the four or more connection terminals are four connection terminals which are arranged in four corners of the square shape in their corresponding mounting position to be spaced away from each other.

Also, in a light emitting device according to another embodiment of the present invention, in addition to any of the aforementioned embodiment, the plurality of mounting positions in the wiring pattern are arranged in a matrix arrangement.

Also, in a light emitting device according to another embodiment of the present invention, in addition to any of the aforementioned embodiment, at least one of the four or more connection terminals in the mounting positions that are located in the corners of the matrix arrangement is not connected to any connection terminal.

Also, in a light emitting device according to another embodiment of the present invention, in addition to any of the aforementioned embodiment, the plurality of light emitting elements include first, second, third and fourth light emitting elements.

In addition, the plurality of mounting positions include a first mounting position at which the first light emitting element is mounted, a second mounting position at which the second light emitting element is mounted, a third mounting position at which the third light emitting element is mounted, and a fourth mounting position at which the fourth light emitting element is mounted.

In addition, first, second, third and fourth connection terminals for the first light emitting element are arranged in the first mounting position.

In addition, first, second, third and fourth connection terminals for the second light emitting element are arranged in the second mounting position.

In addition, first, second, third and fourth connection terminals for the third light emitting element are arranged in the third mounting position.

In addition, first, second, third and fourth connection terminals for the fourth light emitting element are arranged in the fourth mounting position.

In addition, first, second, and third extended parts are arranged as the extended part.

In addition, the first connection terminal for the first light emitting element is connected to an external connection terminal.

In addition, the third connection terminal for the first light emitting element and the fourth connection terminal for the first light emitting element are connected to the first connection terminal for the second light emitting element and the second connection terminal for the second light emitting element, respectively, through their corresponding first extended part.

In addition, the fourth connection terminal for the second light emitting element is connected to the third connection terminal for the third light emitting element through the second extended part.

In addition, the first connection terminal for the third light emitting element and the second connection terminal for the third light emitting element are connected to the third connection terminal for the fourth light emitting element and the fourth connection terminal for the fourth light emitting element, respectively, through their corresponding third extended part.

In addition, the second connection terminal for the fourth light emitting element is connected to an external connection terminal or another connection terminal that is adjacent to the second connection terminal for the fourth light emitting element.

Also, in a light emitting device according to another embodiment of the present invention, in addition to any of the aforementioned embodiment, the second connection terminal for the first light emitting element, the third connection terminal for the second light emitting element, the fourth connection terminal for the third light emitting element, the first connection terminal for the fourth light emitting element are isolated so as not to be connected to any connection terminal.

Also, in a light emitting device according to another embodiment of the present invention, in addition to any of the aforementioned embodiment, the wiring pattern further includes a fifth mounting position between the first and second mounting positions, and a sixth mounting position between the third and fourth mounting positions.

In addition, the plurality of light emitting elements further include fifth and sixth light emitting elements which are mounted in the fifth and sixth mounting positions, respectively.

Also, in a light emitting device according to another embodiment of the present invention, in addition to any of the aforementioned embodiment, the connection terminals on the mount board are not externally exposed when the light emitting elements are mounted at the mounting positions.

Also, in a light emitting device according to another embodiment of the present invention, in addition to any of the aforementioned embodiment, a first reflector that covers areas on the mount board other than the wiring pattern is further provided.

The following description will describe embodiments according to the present invention with reference to the drawings. It should be appreciated, however, that the embodiments described below are illustrations of a light emitting device to give a concrete form to technical ideas of the invention, and a light emitting device of the invention is not specifically limited to description below. Additionally, the sizes and the arrangement relationships of the members in the drawings are occasionally exaggerated for ease of explanation. Members same as or similar to those of this invention are attached with the same designation and the same reference numerals and their description is omitted. The same or similar members are provided with the same designation and the same reference numerals, and their repeated description is omitted. Portions attached with the same reference sign in different drawings show the portions or members same as or similar to each other. In addition, a plurality of structural elements in embodiments according to the present invention may be configured as a single part that serves the purpose of a plurality of elements, on the other hand, a single structural element may be configured as a plurality of parts that serve the purpose of a single element. In addition, a plurality of elements in the embodiments and examples of the present disclosure may be configured as a single element that serves the purpose of the plurality of elements, and a single element may be configured as a plurality of elements that serve the purpose of the single element. Also, the description of some of embodiments may be applied to other embodiments or the like. In the following description, although terms for indicating particular directions or positions (e.g., "upper" and "lower", "right", "left", "row", "column" and other terms including these terms) will be used as necessary for ease of understanding the present with reference to the drawings, the technical scope of the present invention is not limited by these terms. The term "comprising" a member used in this specification means that the member is included both as a separate member and a unitary member. The term "comprising" a member used in this specification means that the member may be either a separate member or a unitary member.

First Embodiment

Figure 2:
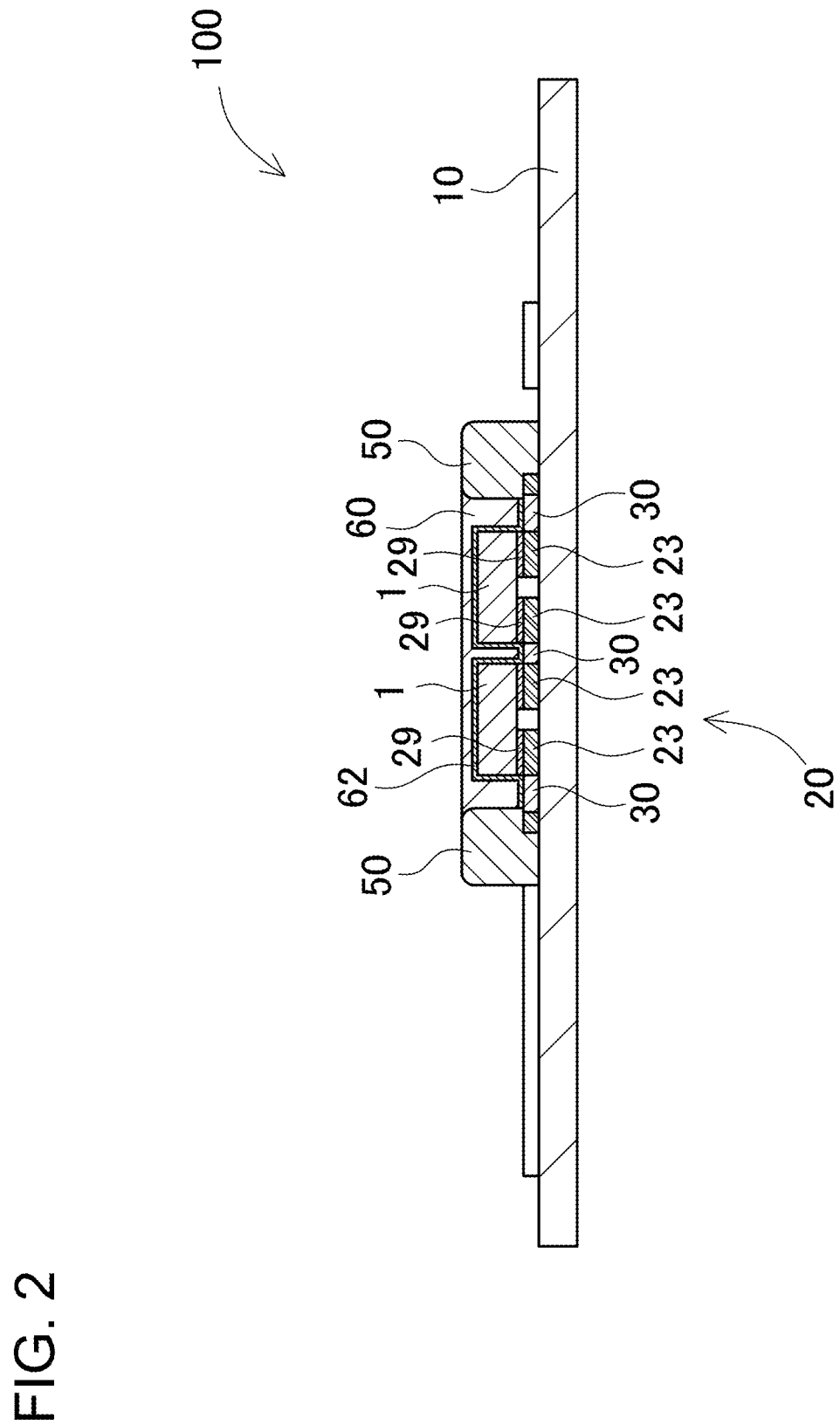
FIG. 2 is a cross-sectional view of the light emitting device shown in FIG. 1 taken along the line II-II.
Figure 3:
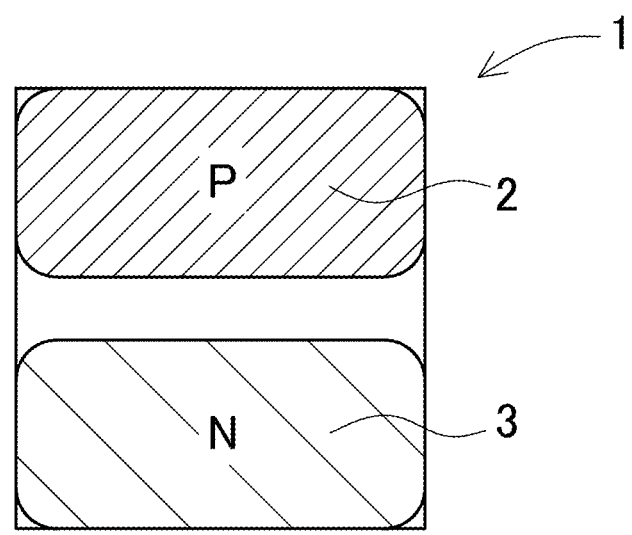
FIG. 3 is a bottom view showing electrodes of a light emitting element shown in FIG. 1.
Figure 4:
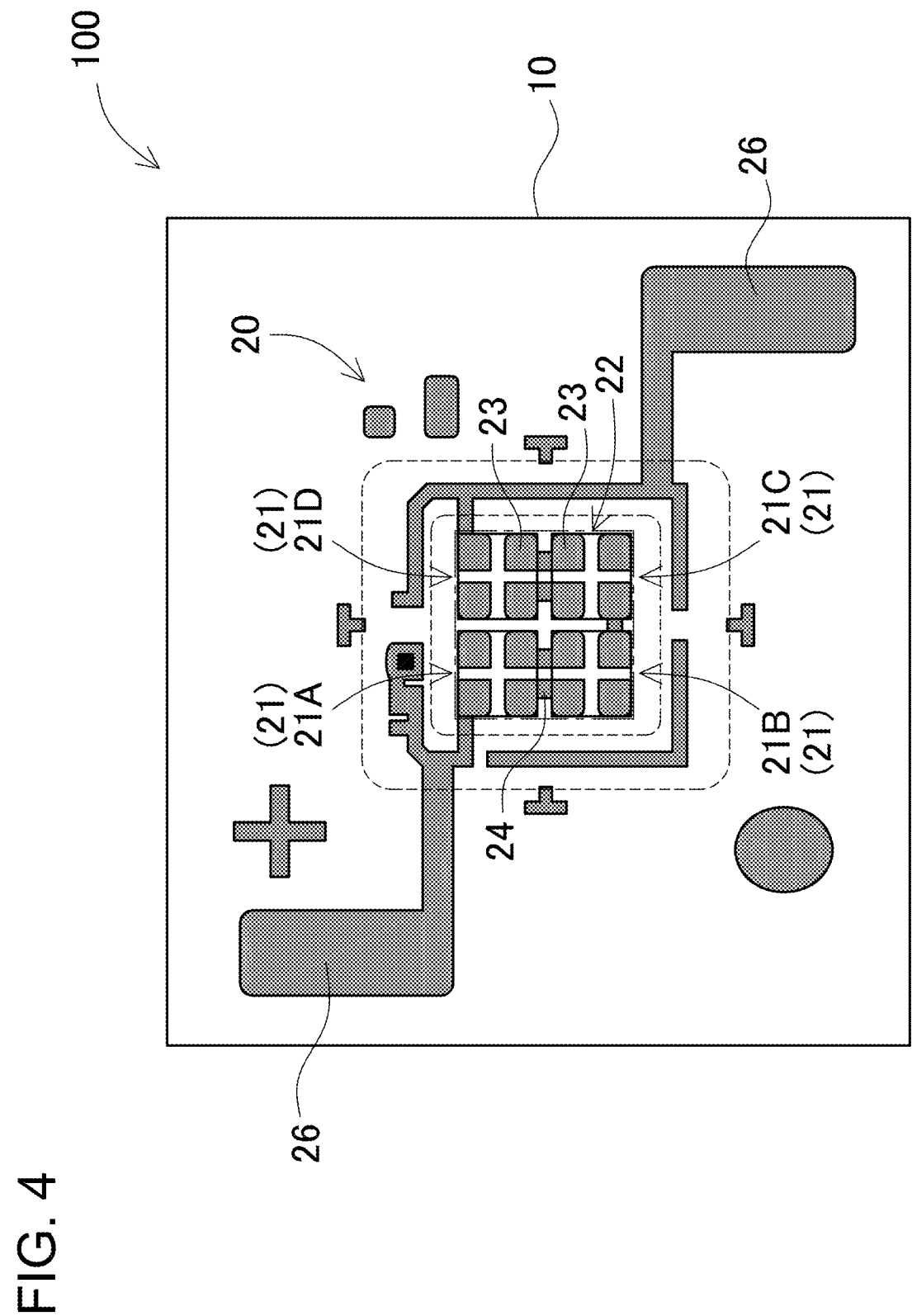
FIG. 4 is a plan view showing a mount board in FIG. 1 with the light emitting element being removed and whose location being indicated by a dashed line for sake of illustration.
Figure 5:
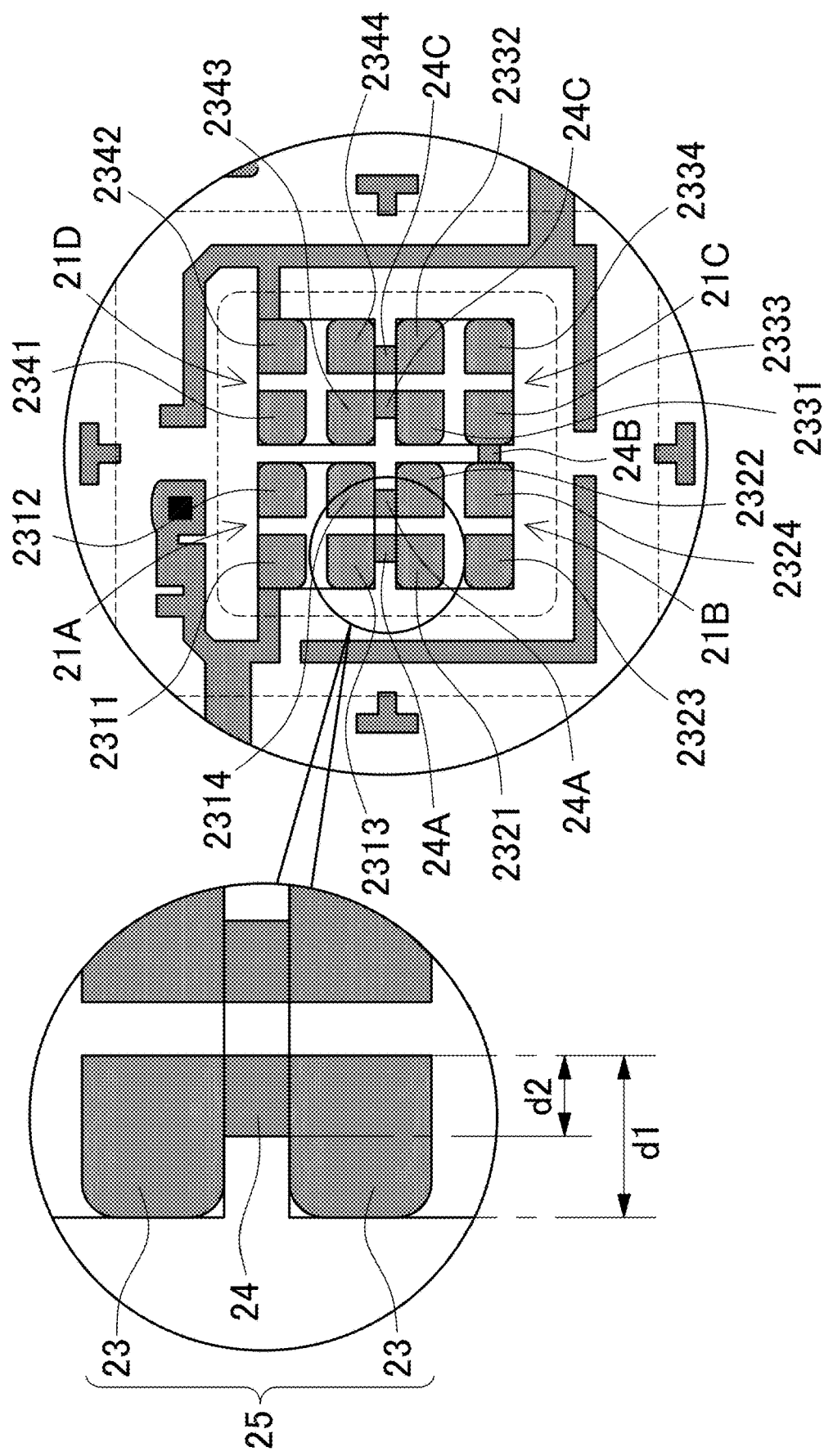
FIG. 5 shows a principle part of the mount board shown in FIG. 4.
Figure 6:
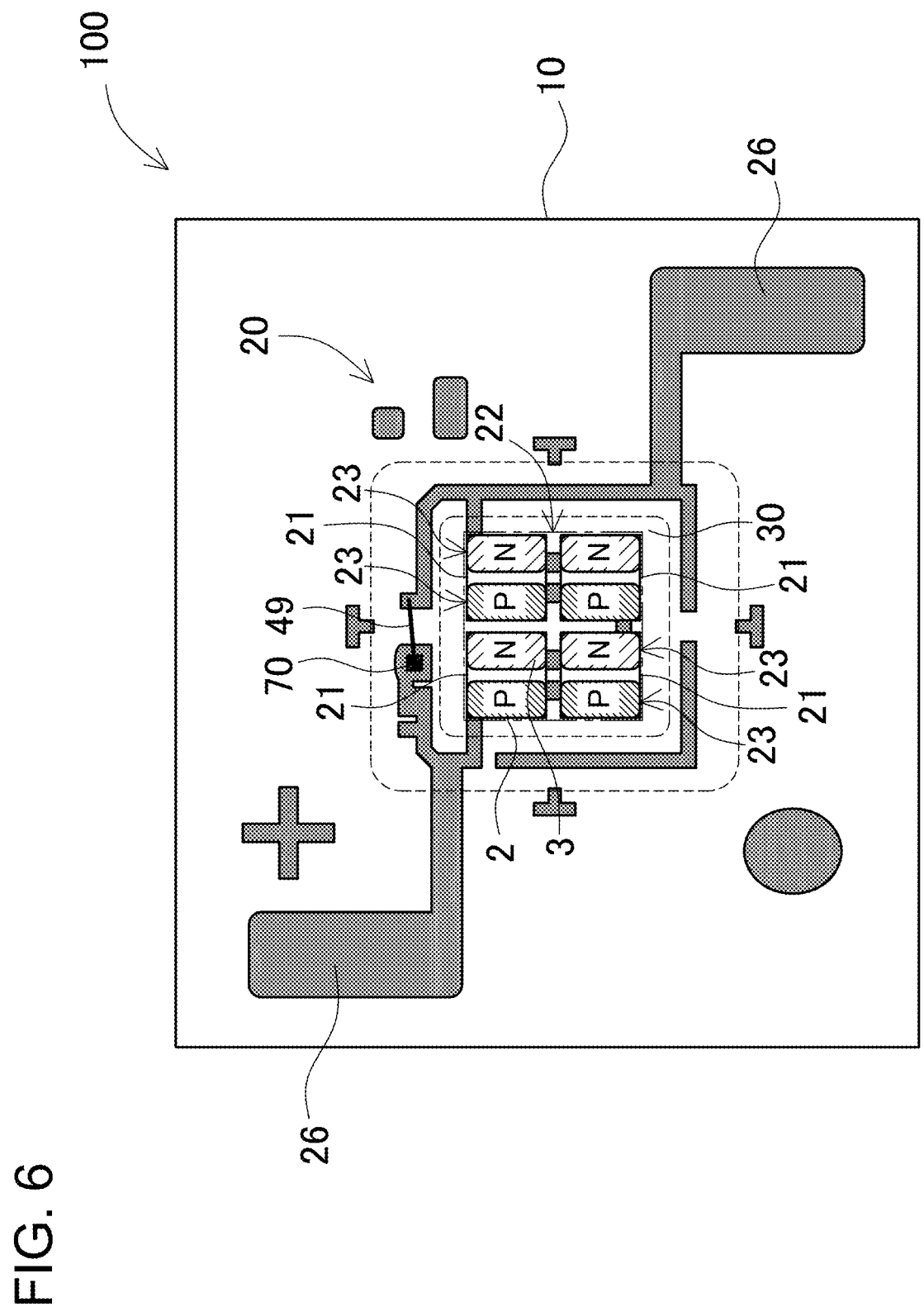
FIG. 6 is a plan view showing an exemplary arrangement of four light emitting elements in which two sets of light emitting elements are connected in series to each other and each set includes two light emitting elements connected in parallel to each other (two-series and two-parallel arrangement) in the mount board shown in FIG. 4.
Figure 7:
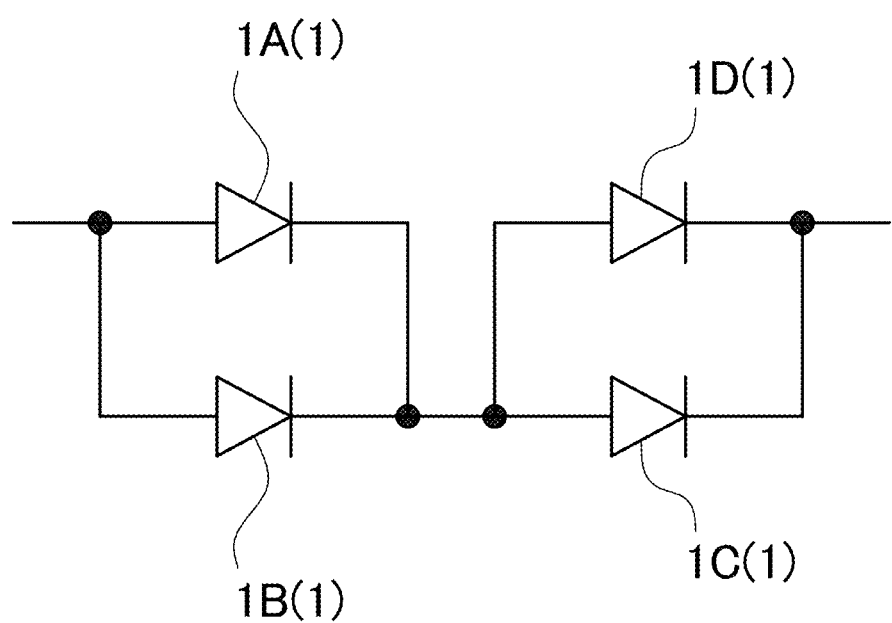
FIG. 7 is a circuit diagram showing connections of the light emitting elements shown in FIG. 6.
Figure 8:
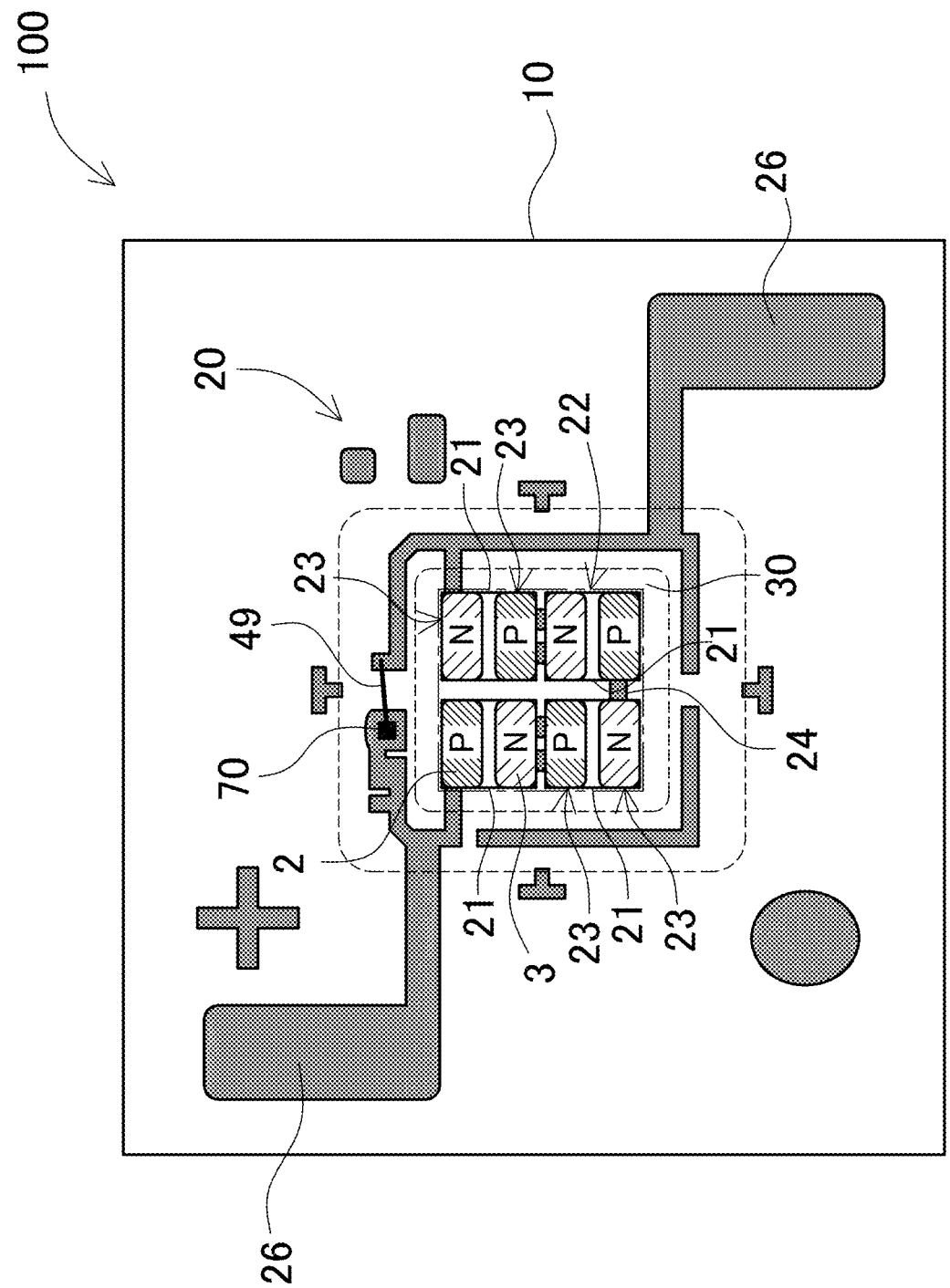
FIG. 8 is a plan view showing an exemplary arrangement of four light emitting elements in which the four light emitting elements are connected in series to each other (four-series arrangement) in the mount board shown in FIG. 4.
Figure 9:
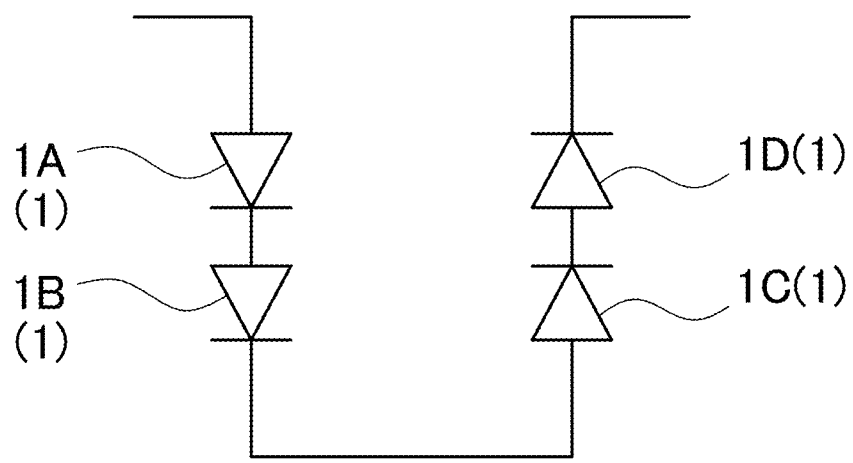
FIG. 9 is a circuit diagram showing connections of the light emitting elements shown in FIG. 8.
Figure 10:
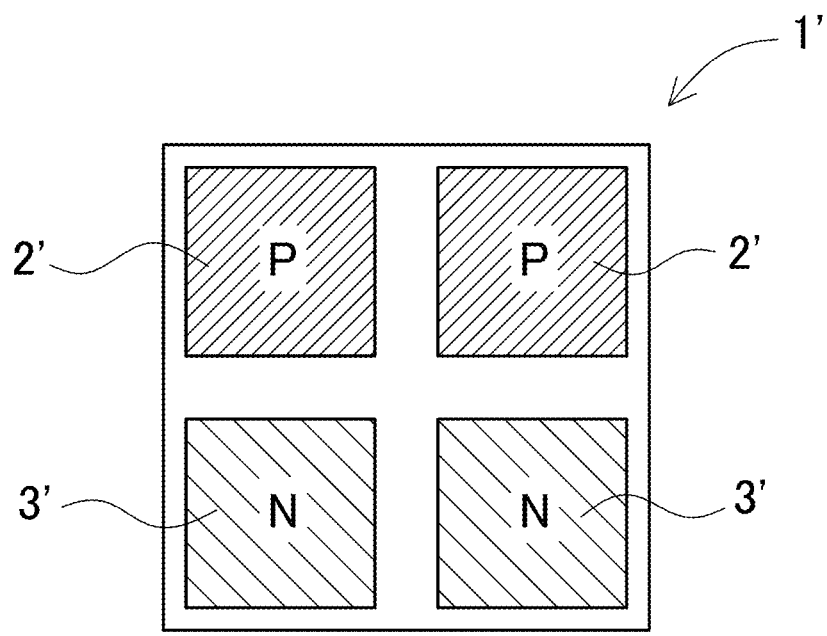
FIG. 10 is a bottom view of a light emitting element according to a modified embodiment illustrating its electrodes.

A light emitting device 100 according to a first embodiment of the present invention is now described with reference to FIGS. 1 to 10. FIG. 1 is a plan view showing the light emitting device 100 according to a first embodiment. FIG. 2 is a cross-sectional view of the light emitting device shown in FIG. 1 taken along the line II-II. FIG. 3 is a bottom view showing electrodes of a light emitting element 1 shown in FIG. 1. FIG. 4 is a plan view showing a mount board 10 in FIG. 1 with the light emitting element being removed and whose location being indicated by a dashed line for sake of illustration. FIG. 5 shows a principle part of the mount board 10 shown in FIG. 4. FIG. 6 is a plan view showing an exemplary arrangement of four light emitting elements 1 in which two sets of light emitting elements 1 are connected in series to each other and each set includes two light emitting elements connected in parallel to each other (two-series and two-parallel arrangement) in the mount board 10 shown in FIG. 4. FIG. 7 is a circuit diagram showing connections of the light emitting elements 1 shown in FIG. 6. FIG. 8 is a plan view showing an exemplary arrangement of four light emitting elements in which the four light emitting elements 1 are connected in series to each other (four-series arrangement) in the mount board 10 shown in FIG. 4. FIG. 9 is a circuit diagram showing connections of the light emitting elements 1 shown in FIG. 8. FIG. 10 is a bottom view of a light emitting element 1 according to a modified embodiment illustrating its electrodes. The illustrated light emitting device 100 include the mount board 10, the light emitting elements 1, a first reflector 30, a second reflector 50, and a cover 60.

The mount board 10 has a board main surface on its upper surface. A predetermined wiring pattern 20 is formed on the board main surface. The mount board 10 includes an electrically insulating base material, and the wiring pattern 20 onto which the light emitting elements 1 are mounted. The wiring pattern 20 is formed on the surface of the base material. Examples of the electrically insulating base material for the mount board 10 can be provided by ceramics, resins (including resins containing reinforcements such as glass epoxy resin), and the like. Examples of a material for ceramic mounts can be provided by alumina, aluminum nitride, and the like. Examples of such resins can be provided by thermosetting resins (e.g., epoxy resin, silicone resin, BT resin, polyimide resin, etc.), and thermoplastic resins, (e.g., polyphthalamide resin, nylon resin, etc.). The base material has a single layer or laminated layers. In this embodiment, a single-layer substrate of aluminum nitride is used. Generally, aluminum nitride has higher heat dissipating performance than resins. For this reason, in the case where aluminum nitride is used for the base material, the heat dissipating performance of the light emitting device 100 can be improved. In addition, the base material may include a coloring agent, a filler, reinforcements, or the like known in the art. Materials with good reflectance are preferably used as the coloring agent. In particular, white materials such as titanium oxide and zinc oxide are more preferably used. Examples of the filler can be provided by silica, alumina, and the like. The examples of the reinforcements can be provided by glass, calcium silicate, potassium titanate, and the like.

In the embodiment shown in FIG. 2, the first reflector 30 is arranged on the surface of the base material (discussed in detail later). The wiring pattern 20 is formed of an electrically conductive material. Specifically, the wiring pattern 20 can be formed of a metallic material such as copper. More specifically, the wiring pattern 20 is constructed of a Cu layer which has a thickness of 30 μm and formed by electrolysis plating, and a Ni/Pd/Au film which is formed by electroless plating in this embodiment. Because the Cu layer is formed thick, sufficient current-carrying capacity and reflectivity can be surely provided.

Light Emitting Element 1

The light emitting elements 1 are mounted on the wiring pattern 20. The light emitting elements 1 are connected in series and/or parallel to each other through the wiring pattern 20. To achieve this, the wiring pattern 20 includes prescribed mounting positions 21 at which their corresponding light emitting element 1 is arranged. The mounting positions 21 are indicated by box lines in the plan views of FIGS. 4, 5, 6, 8, etc. In this embodiment, four mounting positions 21 are arranged in a matrix arrangement, and form a mounting area 22 of the light emitting elements 1. In the drawings, the mounting area 22 is indicated by a single-dot-dashed line. The light emitting elements 1 can be electrically connected in series and/or parallel to each other by mounting the light emitting elements 1 into their corresponding mounting position 21.

A light emitting diode is preferably used as the light emitting element 1, and can be selected from light emitting diodes having various wavelengths depending on the use of the light emitting device. An example of the light emitting diode can be provided by a nitride semiconductor ($In_xA\text{-}l_yGa_{1-x-y}N$, $0 \leq x$, $0 \leq y$, $x+y \leq 1$) light emitting diode which can emit light in the short wavelength range capable of efficiently exciting a later-discussed wavelength converter 62. Various light wavelengths can be provided by selecting materials and mixed crystal ratios of semiconductor layer. The light emitting element 1 has a main wavelength within the range not shorter than 380 nm and not longer than 470 nm.

First Reflector 30

A first reflector 30 covers areas in which the wiring pattern 20 on the mount board 10 is not formed, in other words, areas other than the wiring pattern 20 as shown in the cross-sectional view of FIG. 2. The first reflector 30 reflects parts of light that travel toward the board main surface of the mount board 10 in the light emitted by the light emitting elements 1, and as a result the light extracting efficiency toward the light emitting main surface can be improved. In particular, in the case in which a light-transmissive material is used as the base material of the mount board 10, in order to prevent a part of light that is emitted from the light emitting element 1 toward the lower-surface side from passing through the mount board 10 and to prevent leakage of the parts of light from the back surface side, the first reflector 30 covers areas on the board main surface side other than areas through which the electrically-conductive wiring pattern 20 is exposed. An example of material of the first reflector 30 can be provided by a white resist which includes a resin and white particles having high reflectivity and distributed in the resin, or the like. Examples of the resin can be provided by silicone resin, epoxy resin, fluorine-based resin, and the like. A filler such as titanium oxide and silica can be used as the white particles. For example, such a white resist is formed on the mount board 10 by printing.

Wiring Pattern 20

Connection forms which connect the light emitting elements 1 in series and/or parallel to each other are provided by the wiring pattern 20. In addition, external connection terminals 26 through which electric power is supplied are arranged in end parts of the wiring pattern 20. Generally wiring patterns have a predetermined pattern which provides a fixed connection form, that is, different connection forms cannot be generally provided by one wiring pattern. Contrary to this, according to the light emitting device 100 of this embodiment, different connection forms can be provided by changing orientations of the light emitting elements 1 in their corresponding mounting position 21. According to the light emitting device 100 of this embodiment, different connection forms in which the number of light emitting elements that are connected in series to each other (series-connection number) and the number of light emitting elements that are connected in parallel to each other (parallel-connection number) are changed can be selected by changing orientations of the light emitting elements 1 even by using the fixed wiring pattern 20 formed on the mount board 10. It is noted that the series-connection and parallel-connection numbers include one. In other words, in the case in which the light emitting elements are connected only in series to each other the parallel-connection number is one, and in the case in which the light emitting elements are connected only in parallel to each other the series-connection number is one.

Electrical Conductor 29

The light emitting elements 1 are mounted onto the wiring pattern 20 by an electrical conductor 29 in a flip chip mounting manner. A bump can be used as the electrical conductor 29. Examples of material of the bump can be provided by Au and its alloy. Eutectic solder (Au—Sn), Pb—Sn, lead-free solder, and the like can be used as other types of electrical conductor 29. That is, the electrical conductor 29 is not limited to bumps, and can be electrical conductive paste such as eutectic solder (Au—Sn), Pb—Sn, and lead-free solder. Also, it is preferable that the light emitting elements are mounted by eutectic bonding onto the wiring pattern. For example, Au—Sn or the like can be suitably used. In this case, such an eutectic material can provide sufficient thickness so that current paths can be thick. As a result, concentration of current in the electrodes of the light emitting elements can be reduced.

The light emitting element 1 includes a pair of electrodes on its back surface side, as shown in FIG. 3. P-side and N-side electrodes 2 and 3 are arranged on the upper and lower sides, respectively, in FIG. 3 to be spaced away from and electrically insulated from each other. The wiring pattern 20 includes a plurality of connection terminals 23 which can connect the light emitting elements 1 to each other when the light emitting elements 1 are mounted at their corresponding mounting position 21.

Connection Terminal 23

Four or more connection terminals 23 are arranged in each of the mounting positions 21. The four or more connection terminals 23 are spaced away from and electrically insulated from each other. The distance between connection terminals corresponds to the distance between the P and N electrodes 2 and 3. The aforementioned mounting positions 21 are arranged in the wiring pattern 20. In the embodiment shown in FIG. 4, four connection terminals 23 are arranged in each of the mounting positions 21. The connection terminals 23 on the mount board 10 are not externally exposed when the light emitting elements 1 are mounted at the mounting positions 21.

At least one of the four or more connection terminals 23 which are included in one of the mounting positions 21 that are adjacent to each other is electrically connected to at least one of the four or more connection terminals 23 which are included in another adjacent mounting position 21. According to this arrangement, when the light emitting elements 1 are mounted at their corresponding mounting position 21, the light emitting elements 1 are connected in series and/or parallel to each other through the wiring pattern 20. Accordingly, the mounting positions 21 adjacent to each other can be electrically connected to each other by electrical connection between their connection terminals 23 so that electrical conduction in the wiring pattern 20 is surely provided when the light emitting elements 1 are mounted at the mounting positions 21.

Extended Part 24

Extended parts 24 are arranged between the mounting positions 21 that are adjacent to each other to connect their corresponding connection terminal 23 that is included in one adjacent mounting position 21 to their corresponding connection terminal 23 that is included in another adjacent mounting position 21. Specifically, each of the extended parts 24 connects its corresponding connection terminals 23 that are arranged on edge parts of the adjacent mounting positions 21 that face each other to each other. Accordingly, the connection terminals 23 can be connected at the shortest distance by the extended part 24 which connects the connection terminals 23 that are arranged on edge parts of the adjacent mounting positions 21 that face each other to each other. As shown in FIG. 5, the connection terminals 23 that are connected to each other by the extended part 24 are integrally formed to form a land 25.

The extended part 24 has a width d2 smaller than a width d1 of the connection terminal 23 as shown in an enlarged plan view of FIG. 5. Accordingly, the narrow extended part 24 can facilitate self-alignment when the light emitting elements 1 are mounted by eutectic bonding. Also, light absorption by the mounting pattern can be reduced.

Also, the number of the light emitting elements 1 that are connected in series to each other and the number of the light emitting elements 1 that are connected in parallel to each other are determined in accordance with orientations of the light emitting elements 1, which are mounted at their corresponding mounting position 21, in which each electrode straddles its corresponding at least adjacent two of the four or more connection terminals 23 that are spaced away from and adjacent to each other. According to this arrangement, different connection forms, in other words, the number of light emitting elements 1 that are connected in series to each other (series-connection number) and the number of light emitting elements 1 that are connected in parallel to each other (parallel-connection number) can be selected by changing orientations of the light emitting elements 1 which are mounted at their corresponding mounting position 21 even by using the fixed wiring pattern 20 formed on the mount board 10.

Here, the orientations of the light emitting elements which are mounted at their corresponding mounting position refer to orientations of the light emitting elements with respect to their corresponding mounting position. For example, in the wiring pattern 20 shown in FIG. 4, the four light emitting elements 1 are orientated so that P and N electrodes 2 and 3 are arranged on the left and right sides, respectively, as shown in FIG. 6 (orientation which is rotated 90° counterclockwise from the orientation shown in FIG. 3) when mounted at the mounting positions 21 in a flip chip mounting manner. In this orientation, in the four light emitting elements 1, two sets of light emitting elements 1 are connected in series to each other and each set includes two light emitting elements 1 connected in parallel to each other (two-series and two-parallel arrangement) as shown in FIG. 7.

In the wiring pattern 20 shown in FIG. 4, two of the four light emitting elements 1 that are arranged on the left-side column are orientated so that P and N electrodes 2 and 3 are arranged on the upper and lower sides, respectively, (orientation same as FIG. 3), and the other two light emitting elements 1 that are arranged on the right-side column are orientated so that N and P electrodes 3 and 2 are arranged on the upper and lower sides, respectively, (orientation which is rotated 180° from the orientation shown in FIG. 3 (orientated upside down)) when they are mounted at the mounting positions 21 in a flip chip mounting manner as shown in FIG. 8. In this orientation, all the four light emitting elements are connected in series to each other (four-series arrangement)

as shown in FIG. 9. As discussed above, two-series and two-parallel arrangement or four-series arrangement can be selected by changing orientations of the light emitting elements 1 which are mounted at their corresponding mounting position 21 even by using the common wiring pattern 20 shown in FIG. 4. In other words, series-connection number and parallel-connection number can be selected even when the common mount board 10 is used.

The pair of electrodes of the light emitting element 1 have an elongated shape which extends one direction. In the embodiment shown in FIG. 3, the P and N electrodes 2 and 3 have a landscape shape. When the light emitting elements 1 having such a shape are mounted at the mounting positions 21, each electrode electrically connects its corresponding adjacent connection terminals 23 to each other so that the plurality of light emitting elements 1 can be connected in series and/or in parallel to each other. Accordingly, the connection terminals 23 can be connected to each other by the electrodes of the light emitting elements 1 so that electrical conduction in the wiring pattern 20 is provided. As a result, connection in the wiring can be conducted by the electrodes of the light emitting elements 1 without using other members such as wire.

It is noted that the light emitting element 1 includes one P electrode 2 and one N electrode 3 in this embodiment as shown in FIG. 3, the present invention is not limited to this, but the light emitting element can have two or more P and N electrodes. For example, two P electrodes 2' and two n electrodes 3' can be arranged in four corner parts as shown in FIG. 10. Even in the case in which a light emitting element 1' includes these electrodes, different connection forms can be also realized by changing orientations of the light emitting elements 1'. However, from the viewpoint of heat dissipation and current density reduction, the electrodes preferably have a larger area.

A connection form of the light emitting elements 1 can be changed from one to another by changing orientations of the light emitting elements 1 which are mounted at the mounting positions 21, in other words, by rotating the light emitting elements 1. In the embodiment shown in FIG. 4, series-connection number and parallel-connection number in the wiring pattern 20 can be changed in accordance with orientations which are changed from one to another by rotating the light emitting elements 1 by 90°. In this specification, rotating the light emitting elements by 90° refers to rotation by 90° which can include a certain degree of tolerance when the light emitting elements are mounted. For example, in the case in which the rotation of the light emitting element by 90° is specified, even if it is rotated by 90°+/−a few degrees, such a deviation will not affect electrical conduction of the light emitting element. From this viewpoint, rotating the light emitting elements by 90° refers to rotation by 90° which can include such a deviation in this specification.

In order that the light emitting element 1 can be mounted on the mounting position 21 even when it is rotated by 90° from one to another, the light emitting element 1 preferably has a four-fold rotationally symmetrical exterior shape. In particular, the light emitting element 1 preferably has a substantially square shape as viewed in a plan view. In addition, the pair of electrodes of the light emitting element 1 preferably extend along two opposed sides of the square shape.

Also, the mounting position 21 has a square shape corresponding to the square shape of the light emitting element 1. The connection terminals 23 included in the mounting position 21 are arranged in the four corner parts of the square shape to be spaced away from each other.

In addition, the mounting positions 21 are preferably arranged in a matrix arrangement in the wiring pattern 20. In the embodiment shown in FIG. 4, the mounting positions 21 are arranged in a matrix arrangement of two rows and two columns in the wiring pattern. At least one of the four connection terminals 23 in the mounting positions 21 that are located in the corners of the matrix arrangement is not connected to any connection terminal 23.

In the embodiment shown in FIG. 1, the plurality of light emitting elements 1 include first, second, third, and fourth light emitting elements 1A, 1B, 1C, and 1D. Also, the plurality of mounting positions 21 include four mounting positions, more specifically, first, second, third, and fourth mounting positions 21A, 21B, 21C, and 21D at which the light emitting elements 1A, 1B, 1C, and 1D are mounted, respectively, as shown in FIG. 4. Also, the extended parts 24 include first, second, and third extended parts 24A, 24B, and 24C.

As shown in FIG. 5, the first mounting position 21A includes first, second, third, and fourth connection terminals 2311, 2312, 2313, and 2314 for the first light emitting element. Also, the second mounting position 21B includes first, second, third and fourth connection terminals 2321, 2322, 2323, and 2324 for the second light emitting element. Also, the third mounting position 21C includes first, second, third and fourth connection terminals 2331, 2332, 2333, and 2334 for the third light emitting element. Also, the fourth mounting position 21D includes first, second, third and fourth connection terminals 2341, 2342, 2343, and 2344 for the fourth light emitting element.

The first connection terminal 2311 for the first light emitting element is connected to the external connection terminal 26. The third connection terminal 2313 for the first light emitting element and the fourth connection terminal 2314 for the first light emitting element are connected to the first connection terminal 2321 for the second light emitting element and the second connection terminal 2322 for the second light emitting element, respectively, through the first extended parts 24A. The fourth connection terminal 2324 for the second light emitting element is connected to the third connection terminal 2333 for the third light emitting element through the second extended part 24B. The first connection terminal 2331 for the third light emitting element and the second connection terminal 2332 for the third light emitting element are connected to the third connection terminal 2343 for the fourth light emitting element and the fourth connection terminal 2344 for the fourth light emitting element, respectively, through the third extended parts 24C. The second connection terminal 2342 for the fourth light emitting element is connected to the external connection terminal 26 or another connection terminal 23 adjacent to the second connection terminal 2342.

On the other hand, the second connection terminal 2312 for the first light emitting element, the third connection terminal 2323 for the second light emitting element, the fourth connection terminal 2334 for the third light emitting element, and the first connection terminal 2341 for the fourth light emitting element are isolated so as not to be connected to any connection terminal. Although these connection terminals 23 do not provide electrical connection, they provide areas for bonding the light emitting elements 1 by using solder or the like, and facilitate self-alignment of the light emitting elements 1 when the light emitting elements 1 are mounted. In addition, they can improve heat dissipation when current is applied after the light emitting elements 1 are mounted.

In the wiring pattern 20, as shown in FIG. 6, the four light emitting elements 1 are mounted in a horizontal-alignment orientation (P and N electrodes 2 and 3 are aligned in the horizontal direction), in other words in an orientation in which the P and N electrodes 2 and 3 are arranged on the left and right sides, respectively, so that the two-series and two-parallel arrangement is realized as shown in FIG. 7. In this case, because all the light emitting elements 1 are orientated in the same orientation, they can be easily mounted.

On the other hand, in the same wiring pattern 20, as shown in FIG. 8, four light emitting elements 1 are mounted in a vertical-alignment orientation (P and N electrodes 2 and 3 are aligned in the vertical direction) so that the four-series arrangement is realized as shown in FIG. 9. In this case, the four light emitting elements 1 are mounted in a flip chip mounting manner so that the P and N electrodes 2 and 3 are arranged on the upper and lower sides, respectively, on the left column, and conversely the N and P electrodes 3 and 2 are arranged on the upper and lower sides, respectively, on the right column. As discussed above, different connection forms, in other words, series-connection and parallel-connection numbers can be selected by changing orientations of the light emitting elements 1 even by using the mount board 10 which has the same wiring pattern 20.

Second Embodiment

Figure 11:
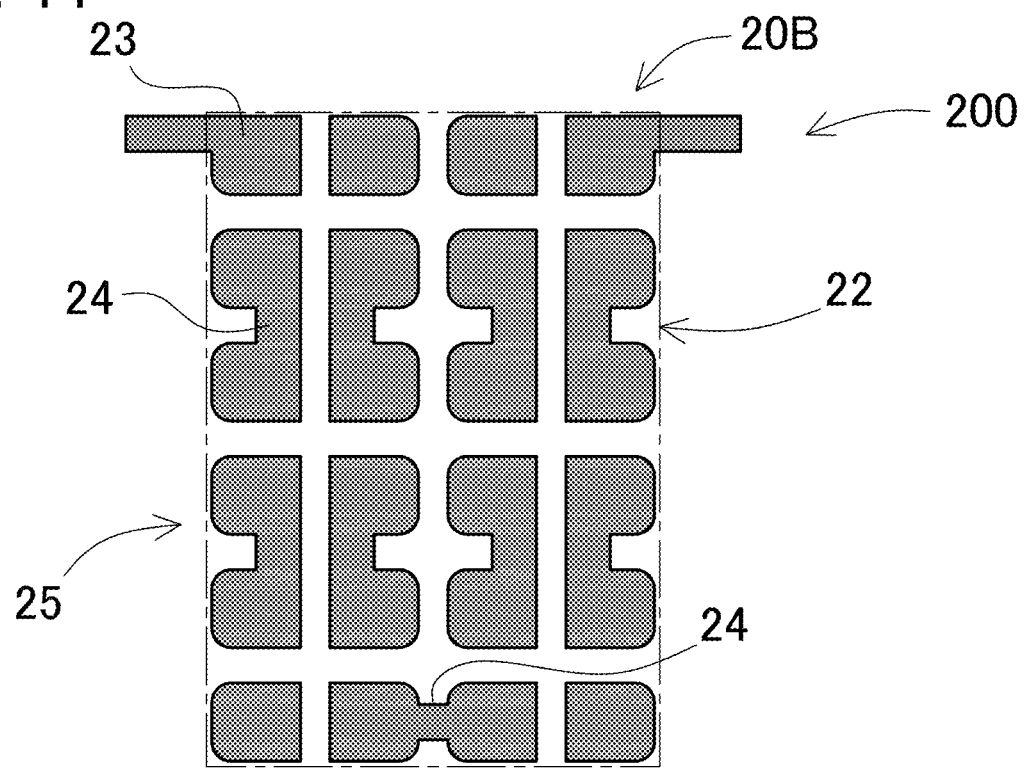
FIG. 11 is a plan view showing a wiring pattern of a light emitting device according to a second embodiment.
Figure 12:
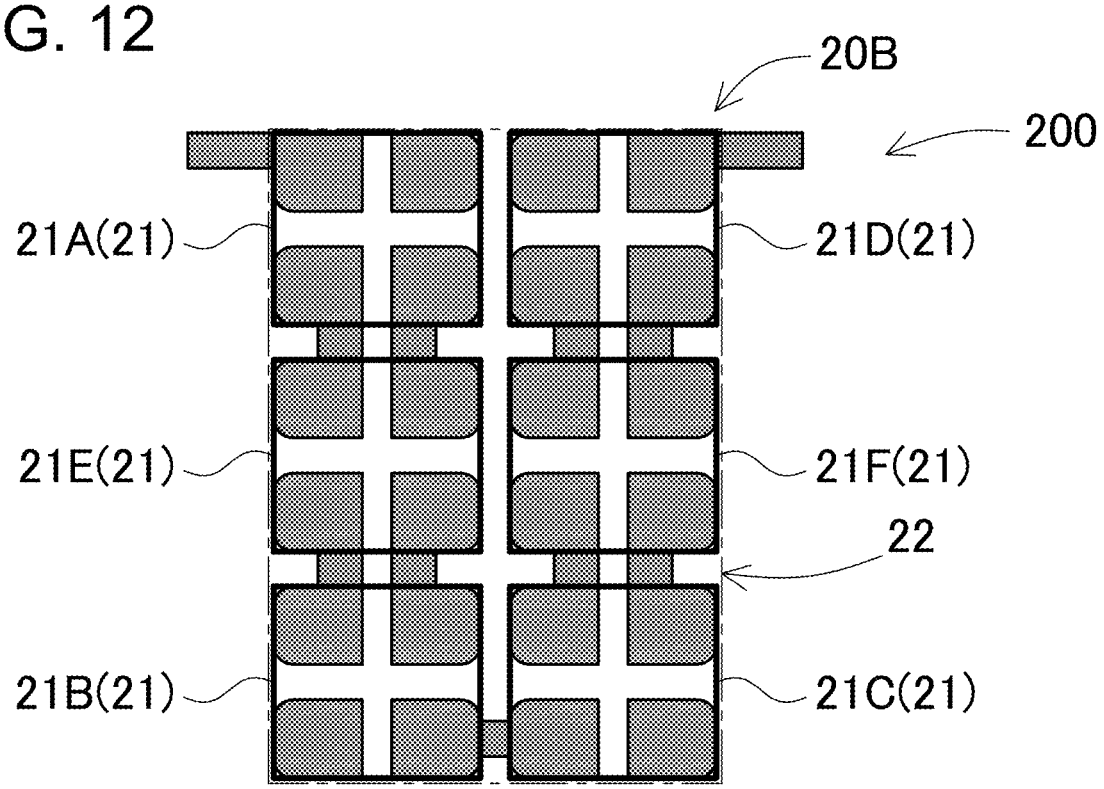
FIG. 12 is a plan view showing a mounting area in the wiring pattern shown in FIG. 11.
Figure 13:
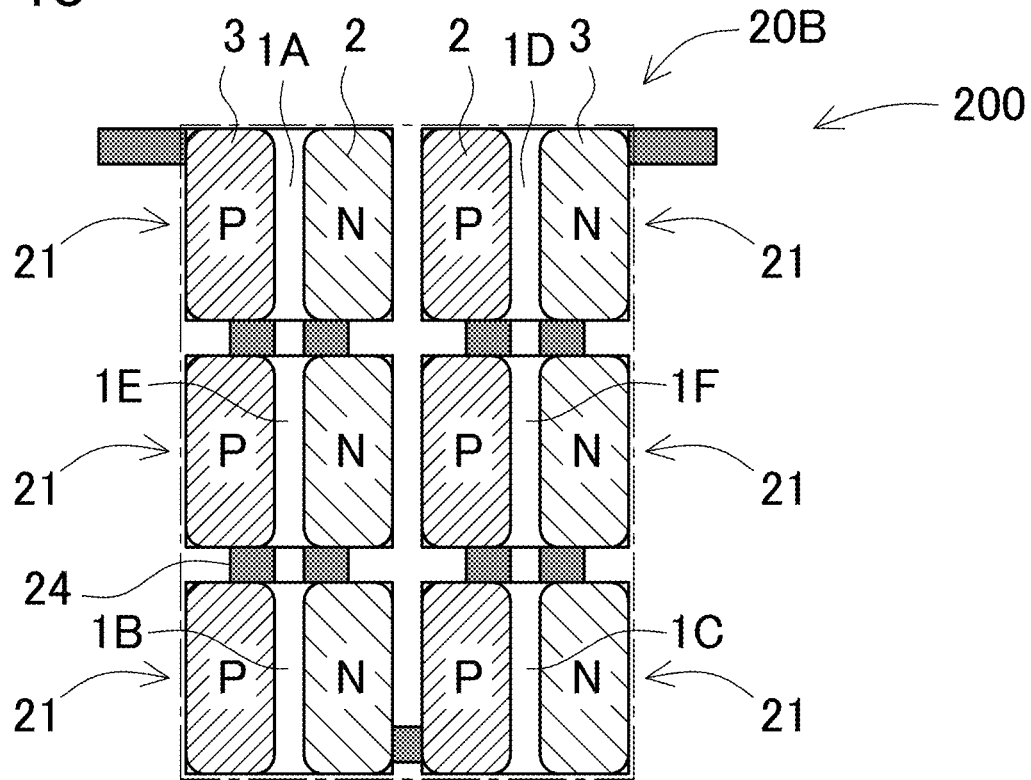
FIG. 13 is a plan view showing an exemplary arrangement of six light emitting elements arranged in the mounting area shown in FIG. 12 in which two sets of light emitting elements are connected in series to each other and each set includes three light emitting elements connected in parallel to each other (two-series and three-parallel arrangement)
Figure 14:
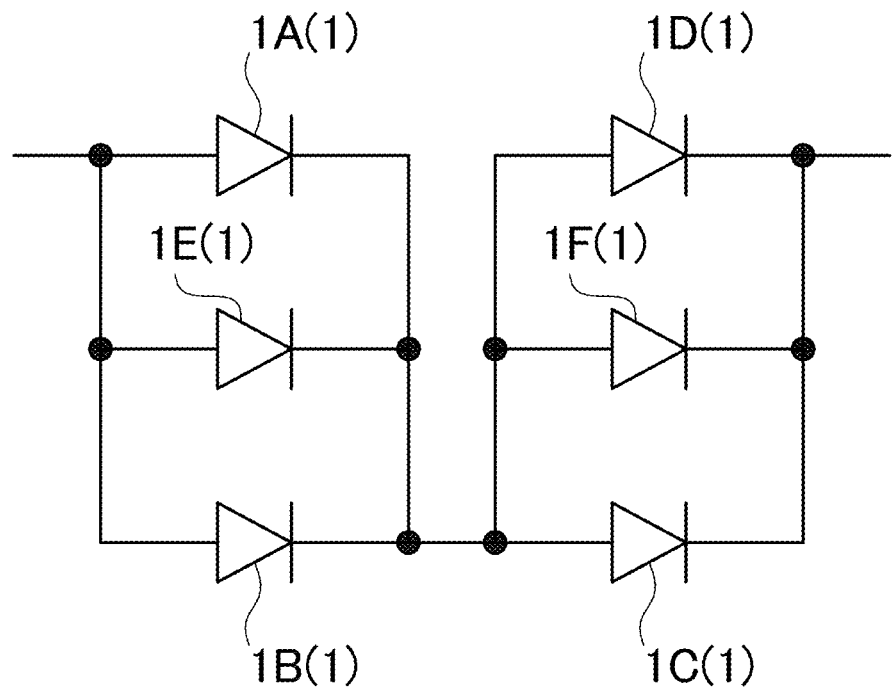
FIG. 14 is a circuit diagram showing connections of the light emitting elements shown in FIG. 13.
Figure 15:
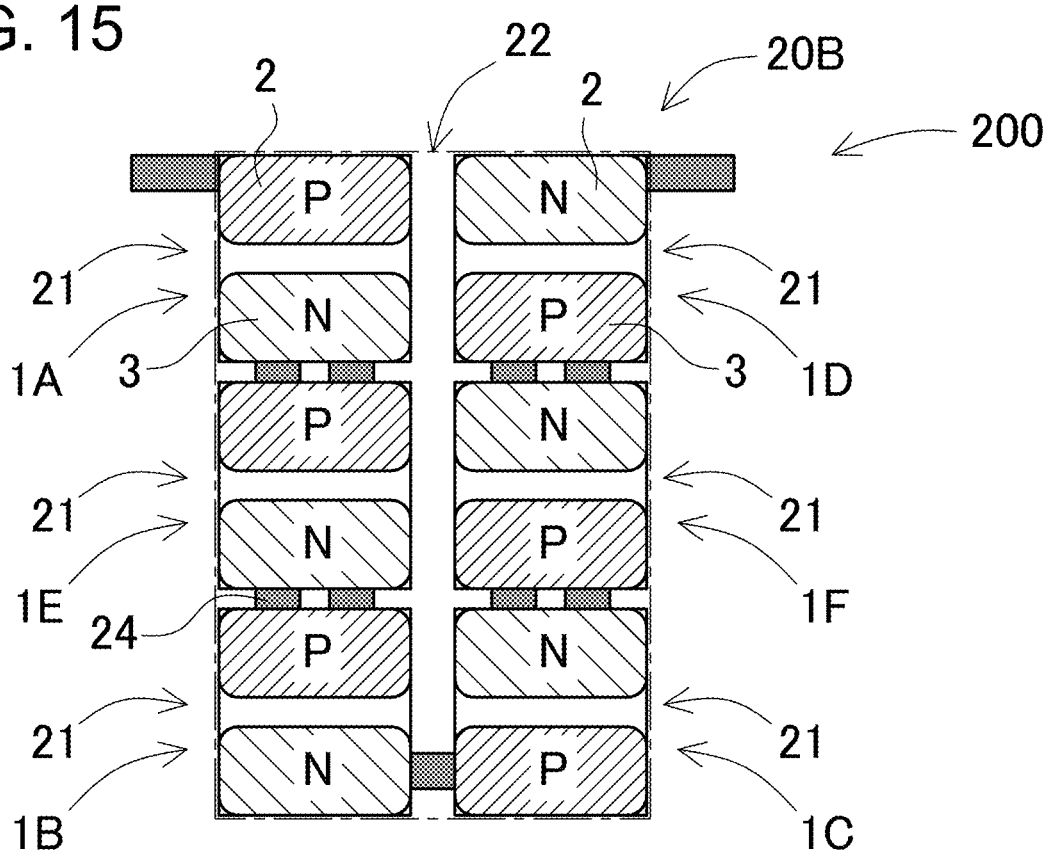
FIG. 15 is a plan view showing an exemplary arrangement of six light emitting elements arranged in the mounting area shown in FIG. 12 in which the six light emitting elements are connected in series to each other (six-series arrangement)
Figure 16:
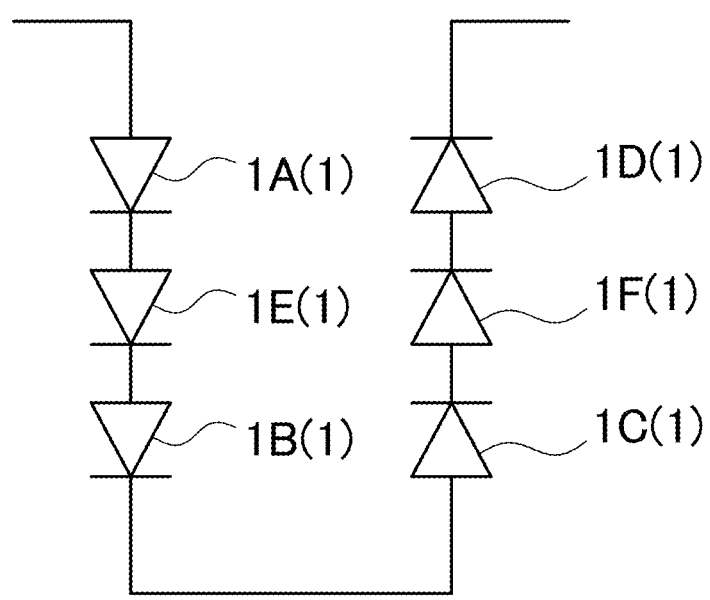
FIG. 16 is a circuit diagram showing connections of the light emitting elements shown in FIG. 15.

It has been described that the four light emitting elements 1 are used in the foregoing embodiment. However, the number of light emitting elements is not limited to four but can be five or more. A light emitting device 200 according to a second embodiment which includes six light emitting elements is now described with reference to FIGS. 11 to 16. FIG. 11 is a plan view showing a wiring pattern 20B of the light emitting device 200 according to the second embodiment. FIG. 12 is a plan view showing a mounting area in the wiring pattern 20B shown in FIG. 11. FIG. 13 is a plan view showing an exemplary arrangement of six light emitting elements 1 arranged in the mounting area shown in FIG. 12 in which two sets of light emitting elements 1 are connected in series to each other and each set includes three light emitting elements 1 connected in parallel to each other (two-series and three-parallel arrangement). FIG. 14 is a circuit diagram showing connections of the light emitting elements 1 shown in FIG. 13. FIG. 15 is a plan view showing an exemplary arrangement of six light emitting elements 1 arranged in the mounting area shown in FIG. 12 in which the six light emitting elements 1 are connected in series to each other (six-series arrangement). FIG. 16 is a circuit diagram showing connections of the light emitting elements 1 shown in FIG. 15.

In the light emitting device 200 according to the second embodiment, the wiring pattern 20B shown in FIG. 11 includes a fifth mounting position 21E which is arranged between the first and second mounting positions 21A and 21B, and a sixth mounting position 21F which is arranged between the third and fourth mounting positions 21C and 21D. Fifth and sixth light emitting element 1E and 1F are mounted in the fifth and sixth mounting positions 21E and 21F, respectively, in a flip chip mounting manner. According to this arrangement, six mounting position 21 are arranged in three rows and two columns as shown in FIG. 12.

When the six light emitting elements 1 are mounted in the horizontal-alignment orientation in the mounting positions 21 as shown in FIG. 13, the two-series and three-parallel arrangement can be realized as shown in FIG. 14. In this case, all the six light emitting elements 1 are orientated in the same orientation, more specifically, their P and N electrodes 2 and 3 are arranged on the left and right sides, respectively, so that a connection form in which the six light emitting elements 1 are connected both in series and parallel to each other can be realized.

On the other hand, when the six light emitting elements 1 are mounted in the vertical-alignment orientation as shown in FIG. 15, the six-series arrangement can be realized as shown in FIG. 16. In this case, the six light emitting elements 1 are mounted in a flip chip mounting manner so that the P and N electrodes 2 and 3 are arranged on the upper and lower sides, respectively, on the left column, and conversely the N and P electrodes 3 and 2 are arranged on the upper and lower sides, respectively, on the right column. As discussed above, different connection forms, in other words, series-connection and parallel-connection numbers can be selected by changing orientations of the light emitting elements 1 even by using the mount board 10 which has the same wiring pattern 20B.

Third Embodiment

Figure 17:
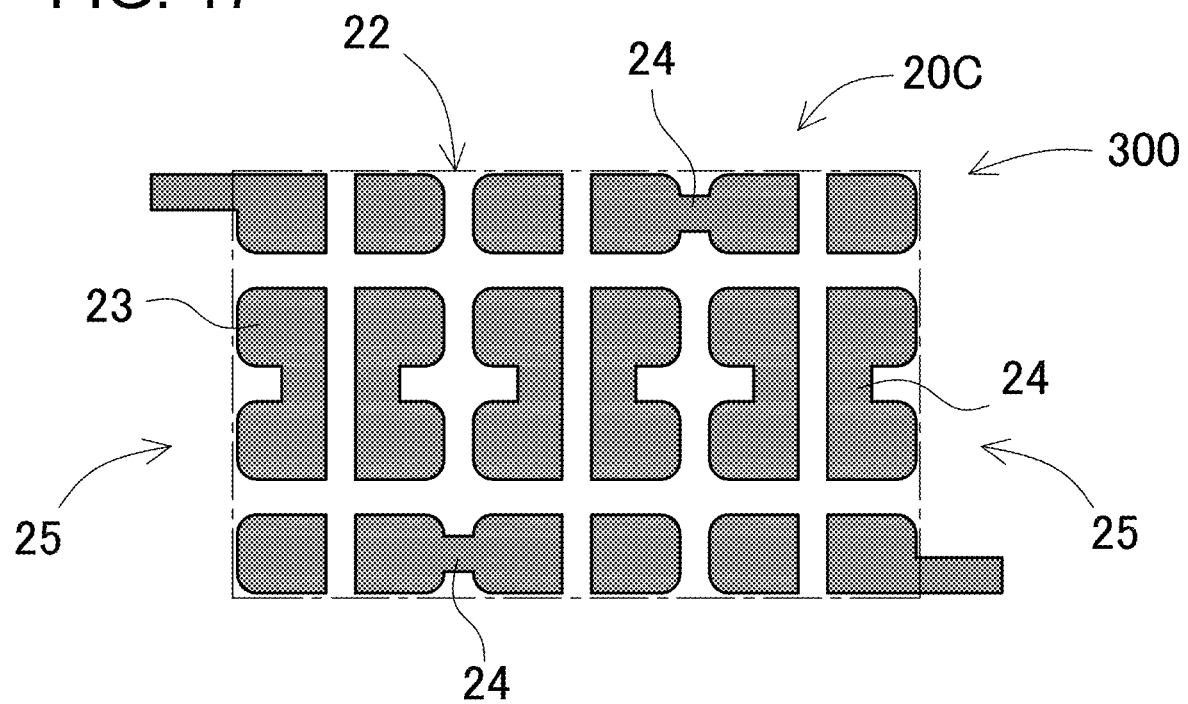
FIG. 17 is a plan view showing a wiring pattern of a light emitting device according to a third embodiment.
Figure 18:
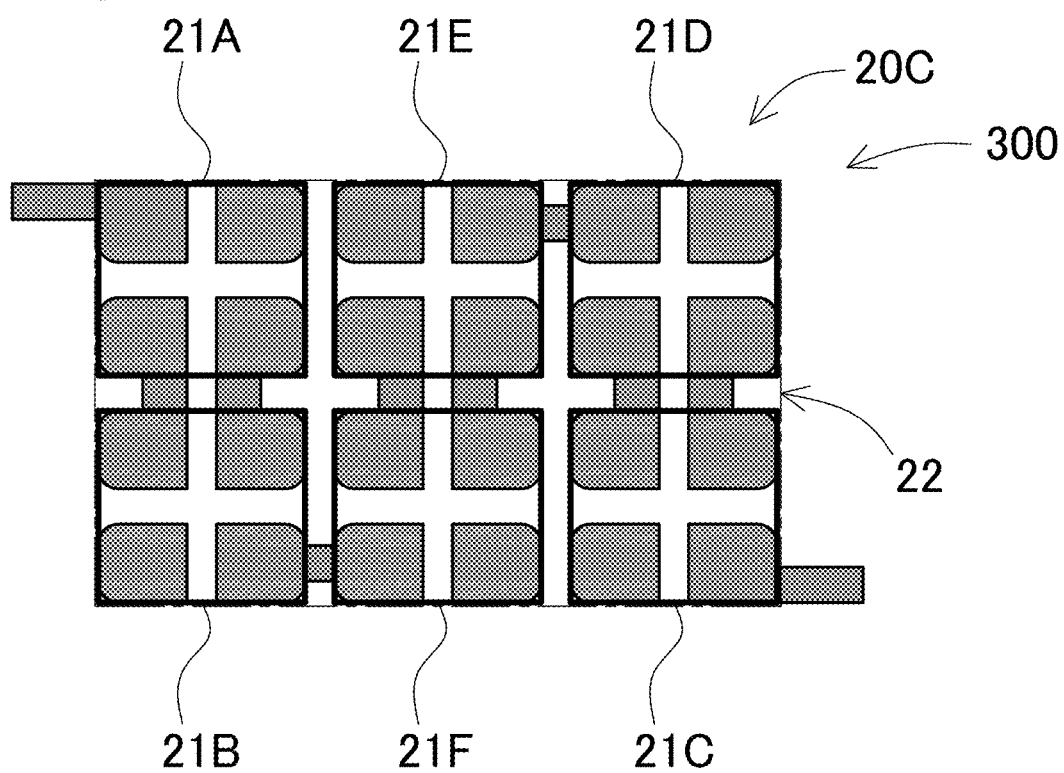
FIG. 18 is a plan view showing a mounting area in the wiring pattern shown in FIG. 17.
Figure 19:
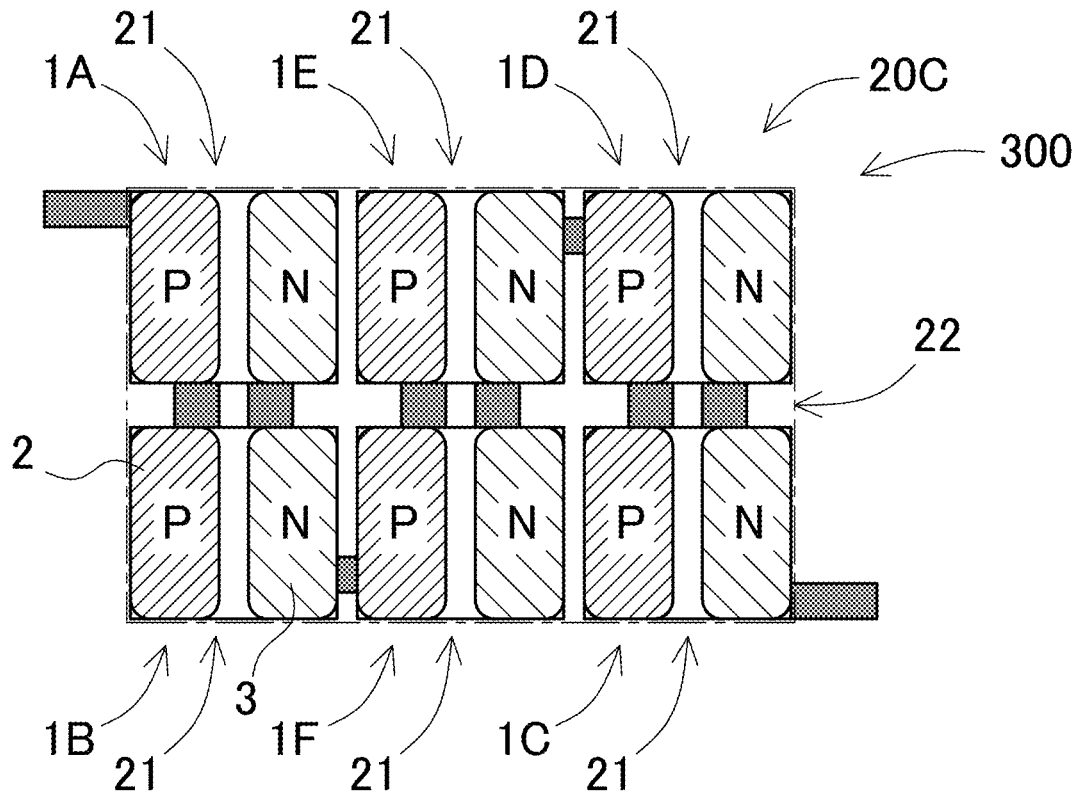
FIG. 19 is a plan view showing an exemplary arrangement of six light emitting elements arranged in the mounting area shown in FIG. 18 in which three sets of light emitting elements are connected in series to each other and each set includes two light emitting elements connected in parallel to each other (three-series and two-parallel arrangement)
Figure 20:
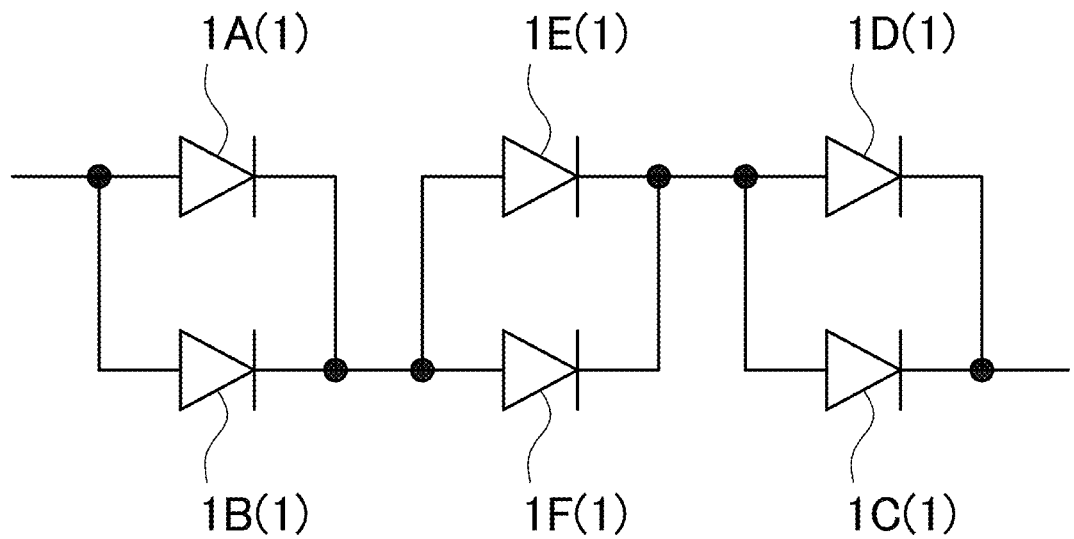
FIG. 20 is a circuit diagram showing connections of the light emitting elements shown in FIG. 19.
Figure 21:
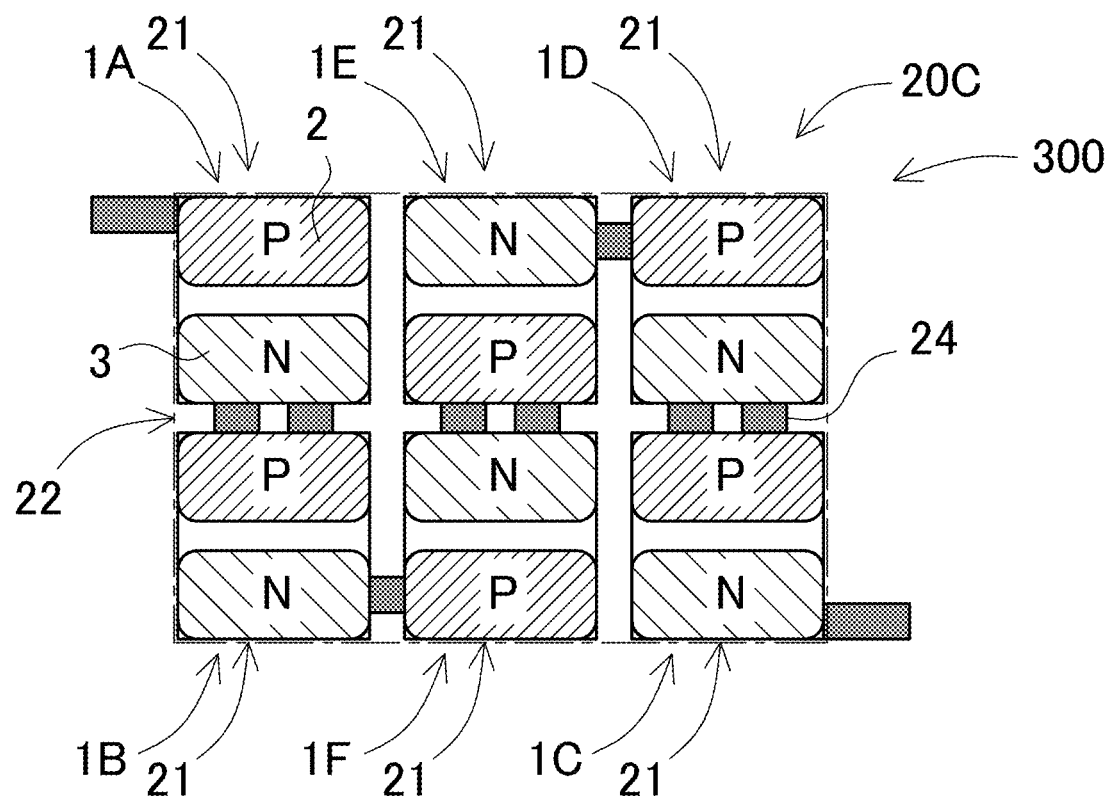
FIG. 21 is a plan view showing an exemplary arrangement of six light emitting elements arranged in the mounting area shown in FIG. 18 in which the six light emitting elements are connected in series to each other (six-series arrangement)
Figure 22:
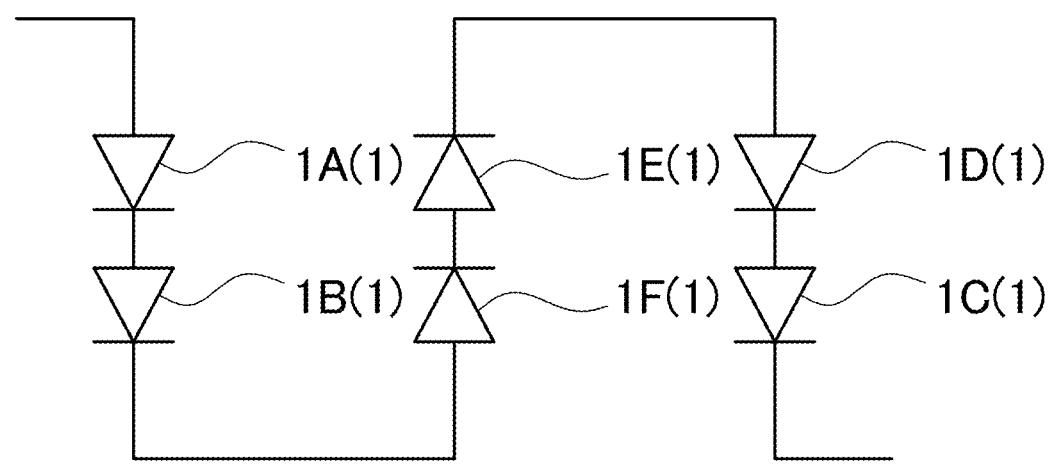
FIG. 22 is a circuit diagram showing connections of the light emitting elements shown in FIG. 21.

It has been described that six mounting positions 21 are arranged in a matrix arrangement of three rows and two columns in the light emitting device 200 according to the foregoing second embodiment. However, the present invention is not limited to this matrix arrangement but any arrangement can be used. A light emitting device 300 according to a third embodiment which includes six light emitting elements 1 arranged in two rows and three columns is now described with reference to FIGS. 17 to 22. FIG. 17 is a plan view showing a wiring pattern 20C of the light emitting device 300 according to the third embodiment. FIG. 18 is a plan view showing a mounting area in the wiring pattern 20C shown in FIG. 17. FIG. 19 is a plan view showing an exemplary arrangement of six light emitting elements 1 arranged in the mounting area shown in FIG. 18 in which three sets of light emitting elements 1 are connected in series to each other and each set includes two light emitting elements 1 connected in parallel to each other (three-series and two-parallel arrangement). FIG. 20 is a circuit diagram showing connections of the light emitting elements 1 shown in FIG. 19. FIG. 21 is a plan view showing an exemplary arrangement of six light emitting elements 1 arranged in the mounting area in which the six light emitting elements 1 are connected in series to each other (six-series arrangement) in the mount board shown in FIG. 18. FIG. 22 is a circuit diagram showing connections of the light emitting elements 1 shown in FIG. 21.

In the light emitting device 300 according to the third embodiment, the wiring pattern 20C shown in FIG. 17 includes a fifth mounting position 21E which is arranged between the first and fourth mounting positions 21A and 21D, and a sixth mounting position 21F which is arranged between the second and third mounting positions 21B and 21C. Fifth and sixth light emitting element 1E and 1F are mounted in the fifth and sixth mounting positions 21E and 21F, respectively, in a flip chip mounting manner. According to this arrangement, six mounting position 21 are arranged in two rows and three columns as shown in FIG. 18.

When the six light emitting elements 1 are mounted in the horizontal-alignment orientation in the mounting positions 21 as shown in FIG. 19, the three-series and two-parallel arrangement can be realized as shown in FIG. 20. Also, in this case, all the six light emitting elements 1 are orientated in the same orientation, more specifically, their P and N electrodes 2 and 3 are arranged on the left and right sides, respectively, so that a connection form in which the six light emitting elements 1 are connected both in series and parallel to each other can be realized.

On the other hand, when the six light emitting elements 1 are mounted in the vertical-alignment orientation as shown in FIG. 21, the six-series arrangement can be realized as shown in FIG. 22. In this case, the six light emitting elements 1 are mounted in a flip chip mounting manner so that the P and N electrodes 2 and 3 are arranged on the upper and lower sides, respectively, on the right and left columns, and conversely the N and P electrodes 3 and 2 are arranged on the upper and lower sides, respectively, on the central column. As discussed above, different connection forms, in other words, series-connection and parallel-connection numbers can be selected by changing orientations of the light emitting elements 1 even by using the mount board 10 which has the same wiring pattern 20C. In the mounting positions 21 which are arranged in a matrix arrangement in the wiring pattern 20C, when the light emitting elements 1 are connected in series to each other as shown in FIG. 22, the light emitting elements 1 are mounted at the mounting positions 21 in a flip chip mounting manner so that the light emitting elements 1 in one column are alternately rotated by 180° from the orientation of the light emitting elements 1 in another column adjacent to the one column as shown in FIG. 21. When a connection form including parallel connection is realized, the light emitting elements 1 in every row are orientated in the same orientation as shown in FIG. 19.

Fourth Embodiment

Figure 23:
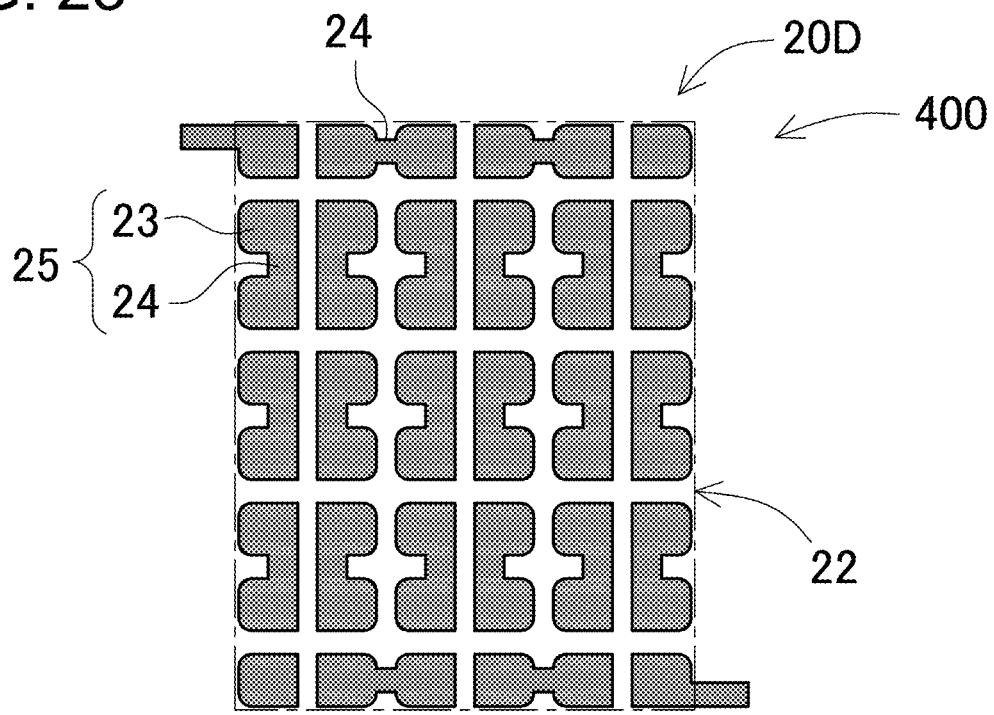
FIG. 23 is a plan view showing a wiring pattern of a light emitting device according to a fourth embodiment.
Figure 24:
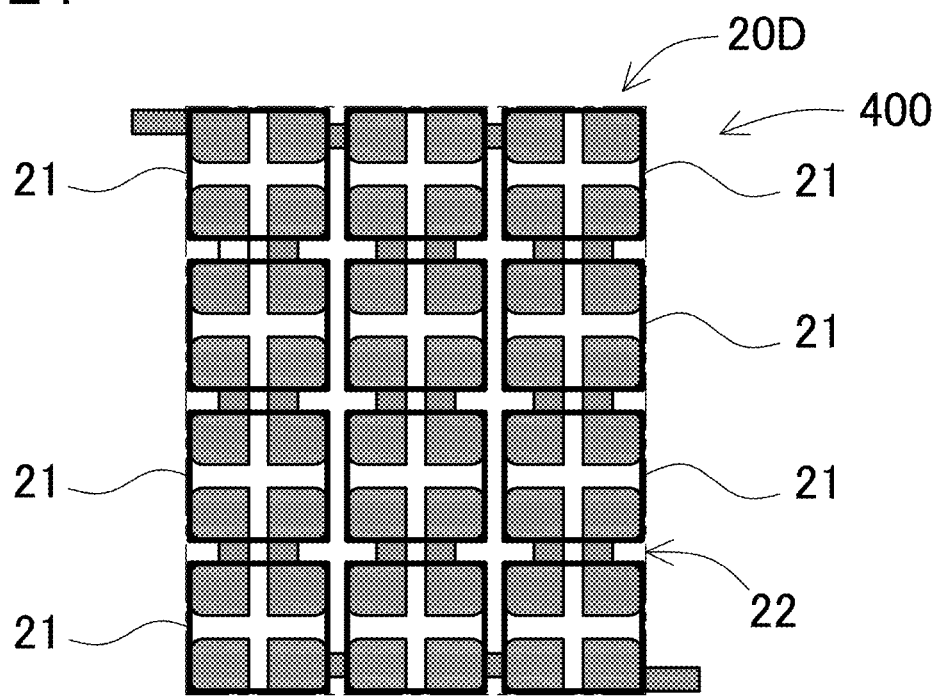
FIG. 24 is a plan view showing a mounting area in the wiring pattern shown in FIG. 23.
Figure 25:
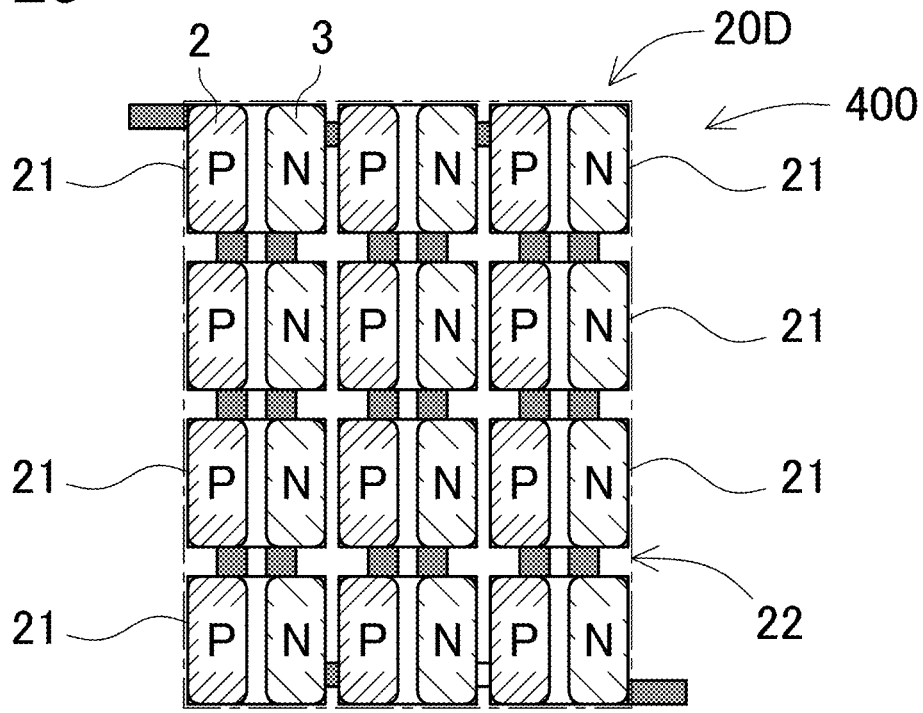
FIG. 25 is a plan view showing an exemplary arrangement of twelve light emitting elements arranged in the mounting area shown in FIG. 24 in which three sets of light emitting elements are connected in series to each other and each set includes four light emitting elements connected in parallel to each other (three-series and four-parallel arrangement)
Figure 26:
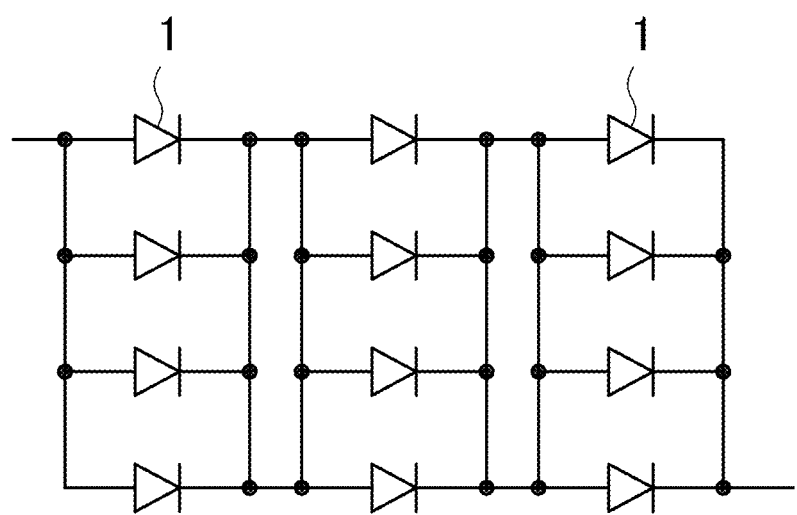
FIG. 26 is a circuit diagram showing connections of the light emitting elements shown in FIG. 25.
Figure 27:
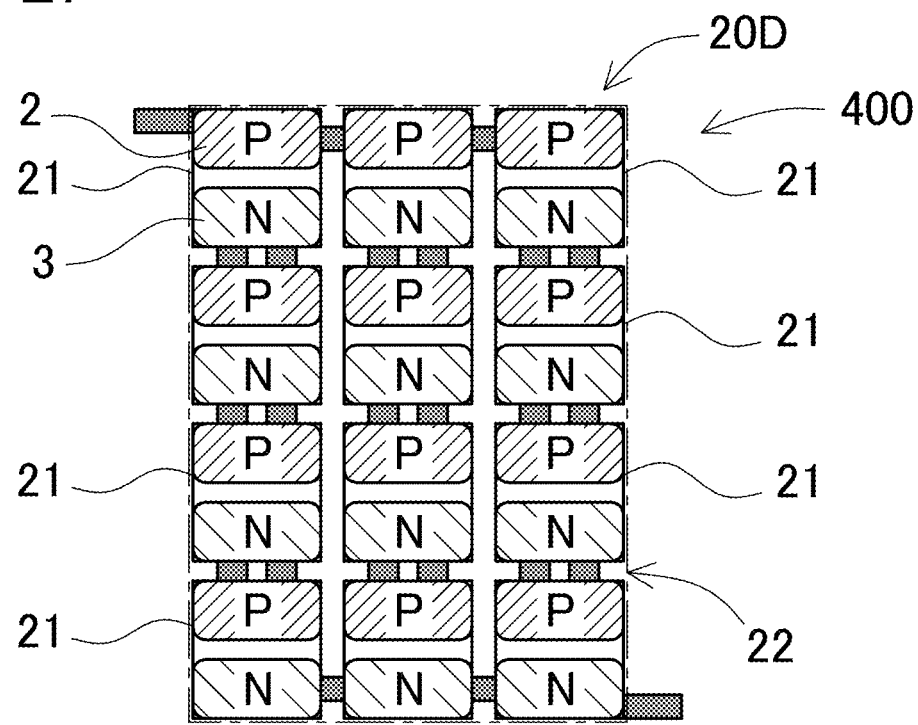
FIG. 27 is a plan view showing an exemplary arrangement of twelve light emitting elements arranged in the mounting area shown in FIG. 24 in which four sets of light emitting elements are connected in series to each other and each set includes three light emitting elements connected in parallel to each other (four-series and three-parallel arrangement)
Figure 28:
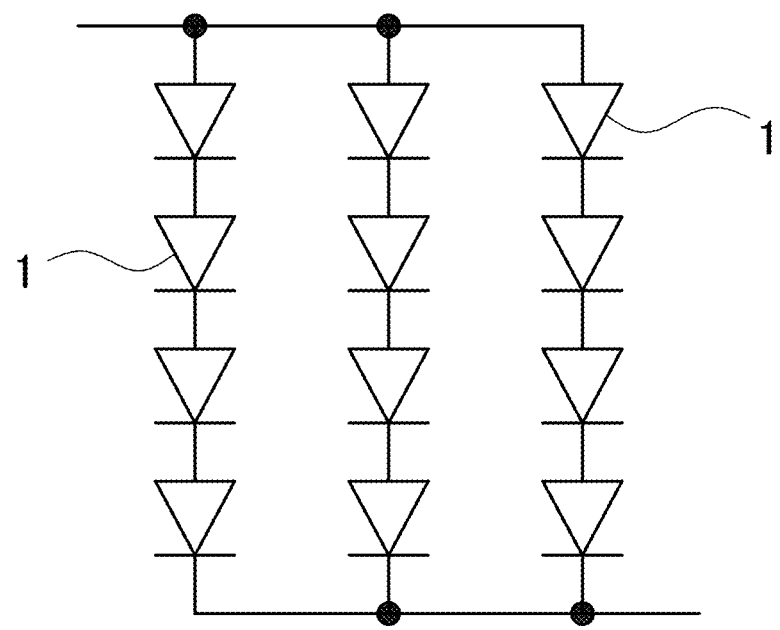
FIG. 28 is a circuit diagram showing connections of the light emitting elements shown in FIG. 27.

It has been described that four are arranged in a matrix arrangement in the foregoing first embodiment, and six mounting positions 21 are arranged in a matrix arrangement in the foregoing second and third embodiments. Needless to say, the number of mounting positions in the present invention is not limited to these, any number of mounting positions can be used. A light emitting device 400 according to a fourth embodiment which includes twelve light emitting elements 21 arranged in four rows and three columns is now described with reference to FIGS. 23 to 28. FIG. 23 is a plan view showing a wiring pattern 20D of the light emitting device 400 according to the fourth embodiment. FIG. 24 is a plan view showing a mounting area in the wiring pattern 20D shown in FIG. 23. FIG. 25 is a plan view showing an exemplary arrangement of twelve light emitting elements 1 arranged in the mounting area shown in FIG. 24 in which three sets of light emitting elements 1 are connected in series to each other and each set includes four light emitting elements 1 connected in parallel to each other (three-series and four-parallel arrangement). FIG. 26 is a circuit diagram showing connections of the light emitting elements 1 shown in FIG. 25. FIG. 27 is a plan view showing an exemplary arrangement of twelve light emitting elements 1 arranged in the mounting area shown in FIG. 24 in which four sets of light emitting elements 1 are connected in series to each other and each set includes three light emitting elements 1 connected in parallel to each other (four-series and three-parallel arrangement). FIG. 28 is a circuit diagram showing connections of the light emitting elements 1 shown in FIG. 27.

In the light emitting device 400 according to the fourth embodiment, as shown in FIG. 24, twelve mounting position 21 are arranged in four rows and three columns in the wiring pattern 20D shown in FIG. 23. When the twelve light emitting elements 1 are mounted in the horizontal-alignment orientation in the mounting positions 21 as shown in FIG. 25, the three-series and four-parallel arrangement can be realized as shown in FIG. 26. Also, in this case, all the twelve light emitting elements 1 are orientated in the same orientation, more specifically, their P and N electrodes 2 and 3 are arranged on the left and right sides, respectively, so that a connection form in which the six light emitting elements 1 are connected both in series and parallel to each other can be realized.

On the other hand, when the twelve light emitting elements 1 are mounted in the vertical-alignment orientation as shown in FIG. 27, the four-series and three-parallel arrangement can be realized as shown in FIG. 28. In this case, the twelve light emitting elements 1 are mounted in a flip chip mounting manner so that the P and N electrodes 2 and 3 are arranged on the upper and lower sides, respectively, in each column. As discussed above, different connection forms, in other words, series-connection and parallel-connection numbers can be selected by changing orientations of the light emitting elements 1 even by using the mount board 10 which has the same wiring pattern 20D. That is, all the light emitting elements 1 are orientated in the same orientation in the mounting positions 21 which are arranged in the wiring pattern 20D in the matrix arrangement so that the light emitting elements 1 are mounted in the horizontal-alignment orientation as shown in FIG. 25 when the three-series and four-parallel arrangement is realized as shown in FIG. 26, and the light emitting elements 1 are mounted in the vertical-alignment orientation as shown in FIG. 27 when the four-series and three-parallel arrangement is realized as shown in FIG. 28. In this embodiment, although all the light emitting elements 1 are orientated in the same orientation, the number of the light emitting elements 1 that are connected in series to each other and the number of the light emitting elements 1 that are connected in parallel to each other can be changed between them by rotating all the light emitting elements 1 by 90°.

Fifth Embodiment

Figure 29:
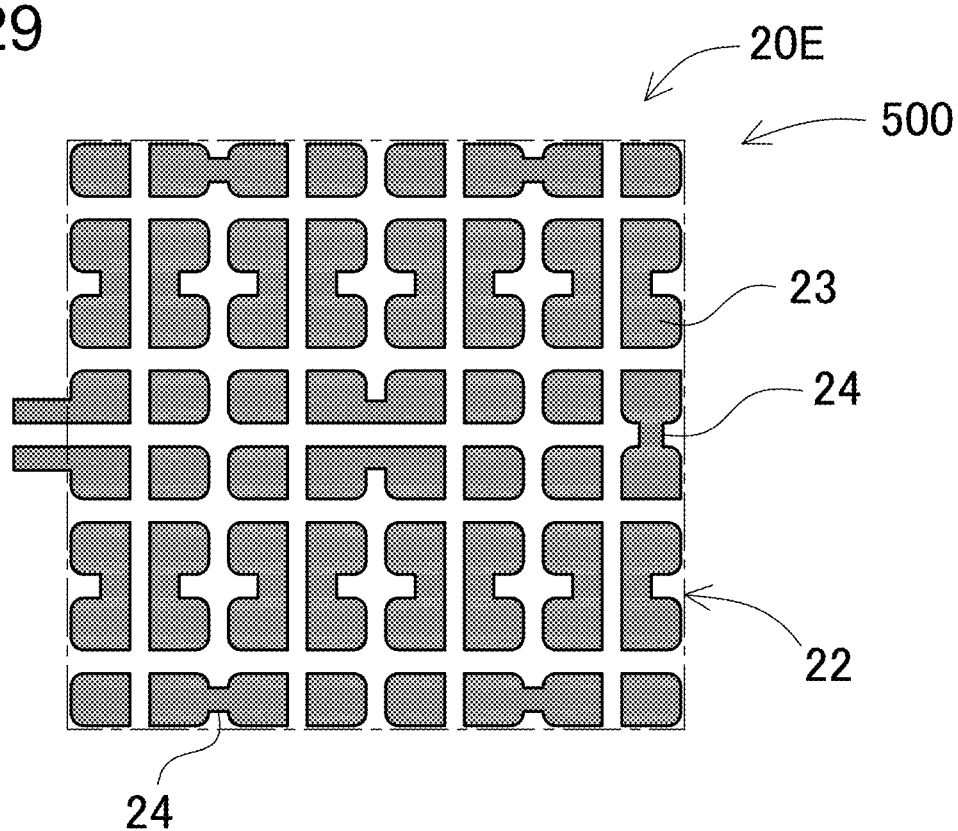
FIG. 29 is a plan view showing a wiring pattern of a light emitting device according to a fifth embodiment.
Figure 30:
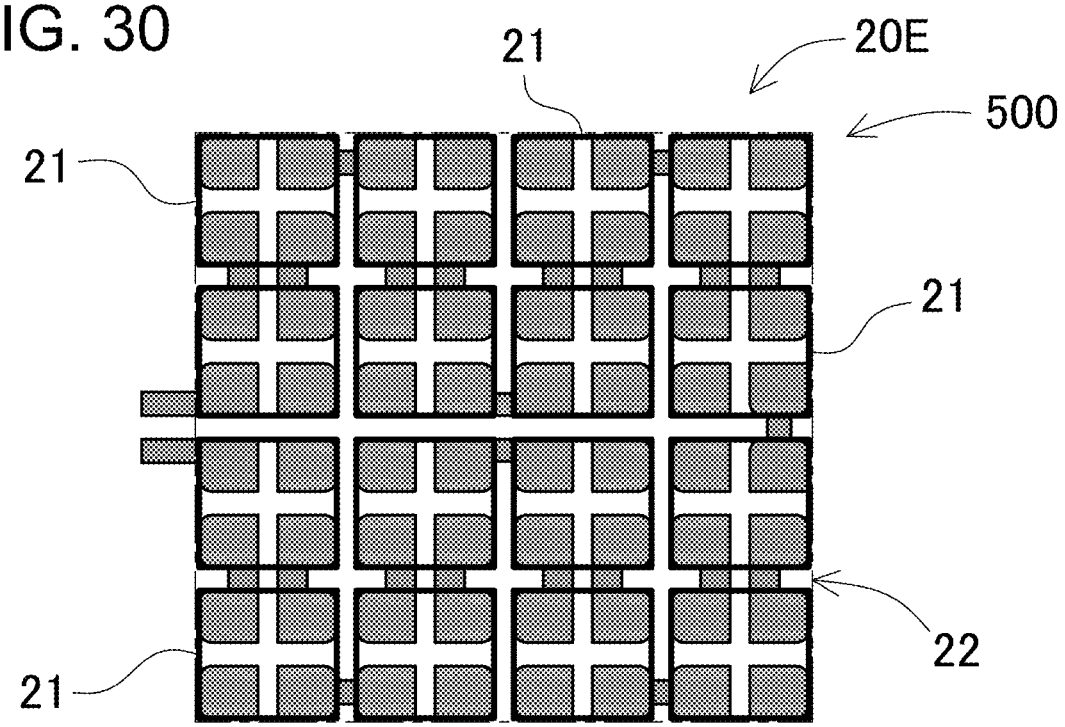
FIG. 30 is a plan view showing a mounting area in the wiring pattern shown in FIG. 29.
Figure 31:
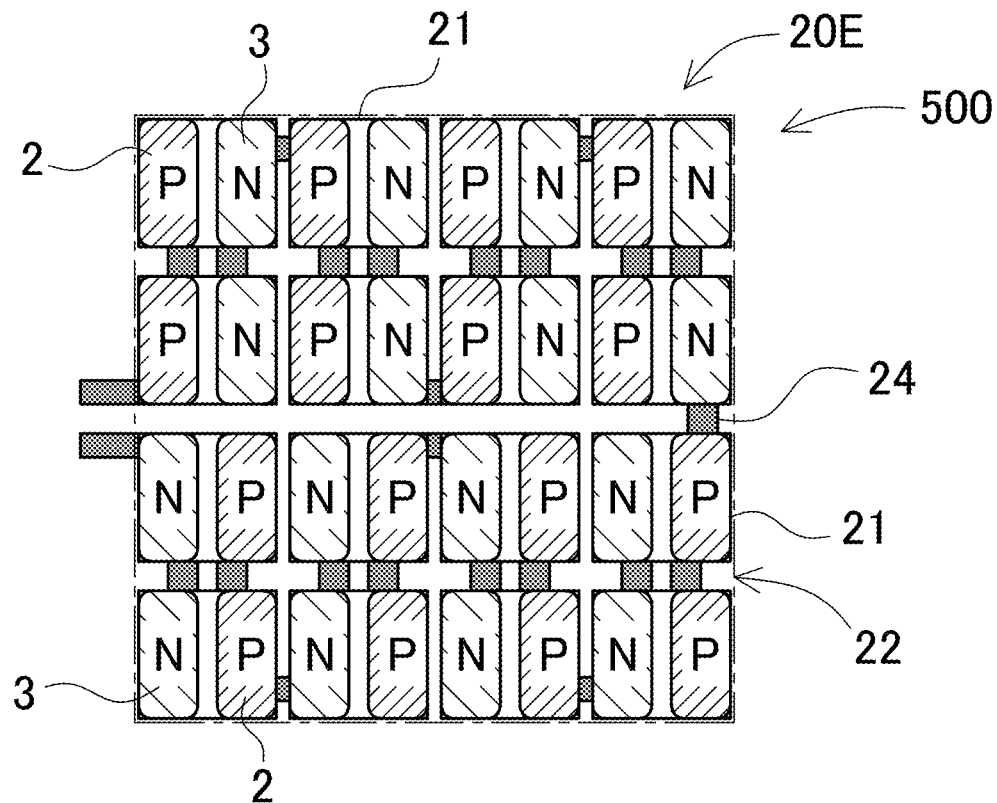
FIG. 31 is a plan view showing an exemplary arrangement of sixteen light emitting elements arranged in the mounting area shown in FIG. 30 in which eight sets of light emitting elements are connected in series to each other and each set includes two light emitting elements connected in parallel to each other (eight-series and two-parallel arrangement)
Figure 32:
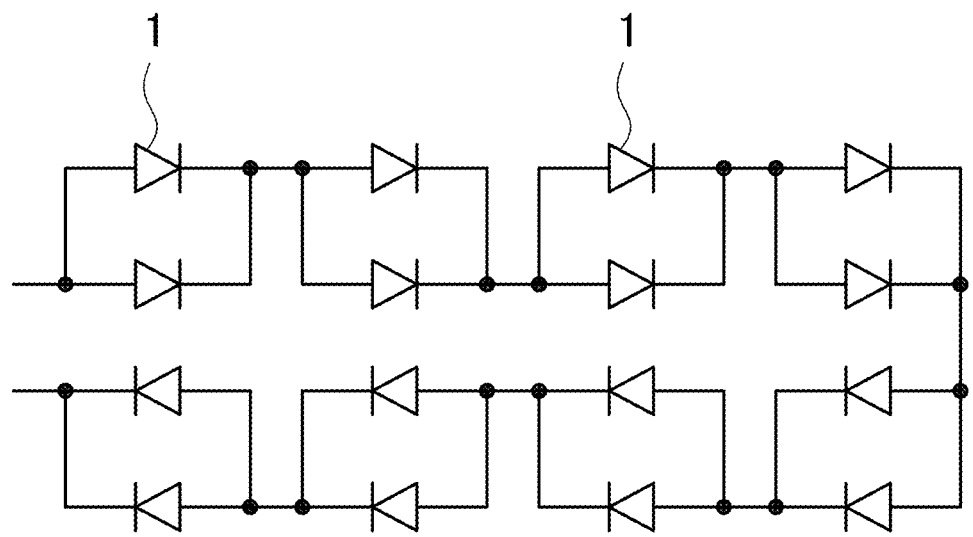
FIG. 32 is a circuit diagram showing connections of the light emitting elements shown in FIG. 31.
Figure 33:
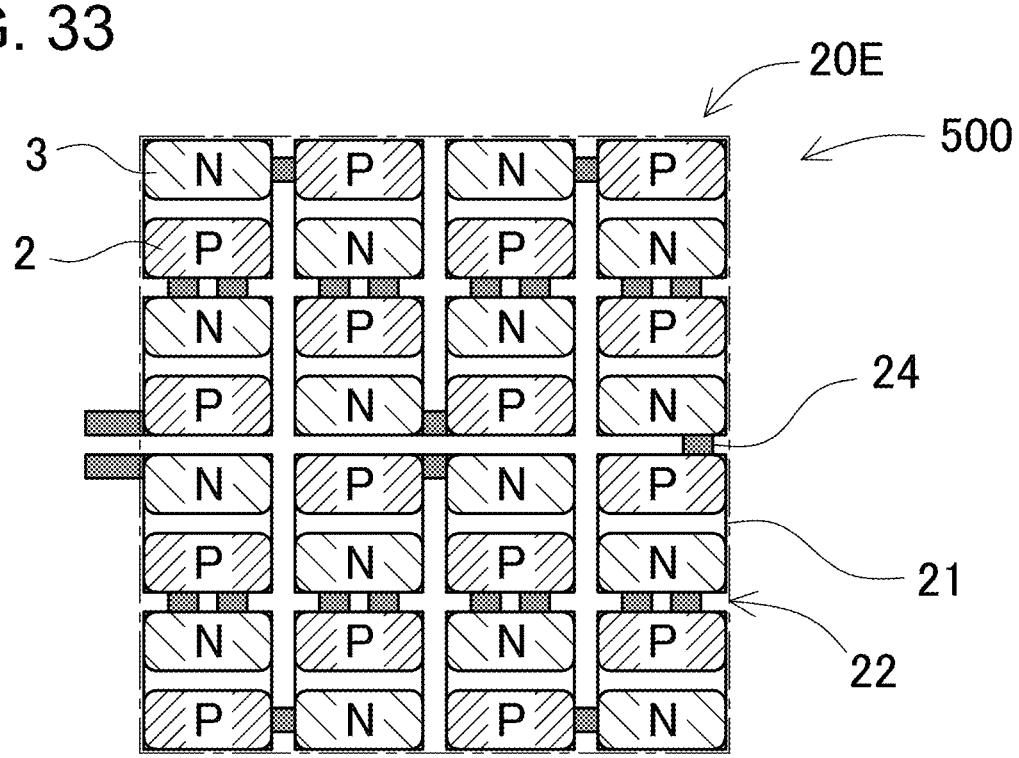
FIG. 33 is a plan view showing an exemplary arrangement of sixteen light emitting elements arranged in the mounting area shown in FIG. 30 in which the sixteen light emitting elements are connected in series to each other (sixteen-series arrangement)
Figure 34:
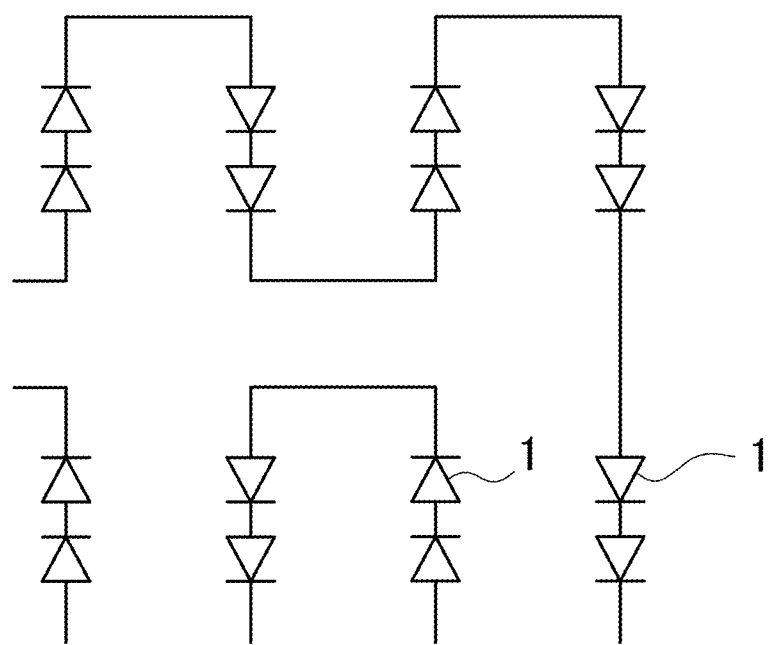
FIG. 34 is a circuit diagram showing connections of the light emitting elements shown in FIG. 33.

It has been described that connection positions which are connected to the external connection terminals 26 to serve as power supply positions in the wiring pattern 20 are arranged in corner parts, that is, diagonal parts (upper left and lower right parts in FIGS. 4, 17, and 23), and the right and left parts on one edge (the right and left parts on the top edge, i.e., upper left and right parts in FIG. 11) in the foregoing embodiments. However, the present invention is not limited to these arrangements. The connection positions which are connected to the external connection terminals 26 in the wiring pattern can be arranged in middle parts on edges. This type of light emitting device 500 according to a fifth embodiment is now described with reference to FIGS. 29 to 34. FIG. 29 is a plan view showing a wiring pattern 20E of the light emitting device 500 according to the fifth embodiment. FIG. 30 is a plan view showing a mounting area in the wiring pattern 20E shown in FIG. 29. FIG. 31 is a plan view showing an exemplary arrangement of sixteen light emitting elements 1 arranged in the mounting area shown in FIG. 30 in which eight sets of light emitting elements 1 are connected in series to each other and each set includes two light emitting elements 1 connected in parallel to each other (eight-series and two-parallel arrangement). FIG. 32 is a circuit diagram showing connections of the light emitting elements 1 shown in FIG. 31. FIG. 33 is a plan view showing an exemplary arrangement of sixteen light emitting elements 1 arranged in the mounting area shown in FIG. 30 in which the sixteen light emitting elements 1 are connected in series to each other (sixteen-series arrangement). FIG. 34 is a circuit diagram showing connections of the light emitting elements 1 shown in FIG. 33.

In the light emitting device 500 according to the fifth embodiment, as shown in FIG. 29, the connection positions which are connected to the external connection terminals 26 are arranged in the central part on the left edge of the wiring pattern 20E. Sixteen mounting positions 21 are arranged in four rows and four columns in the wiring pattern 20E as shown in FIG. 30. When the sixteen light emitting elements 1 are mounted in the horizontal-alignment orientation in the mounting positions 21 as shown in FIG. 31, the eight-series and two-parallel arrangement can be realized as shown in FIG. 32. In this case, the sixteen light emitting elements 1 are mounted in a flip chip mounting manner so that the P and N electrodes 2 and 3 are arranged on the left and right sides, respectively, on the upper half two-row part, and the N and P electrodes 3 and 2 are arranged on the left and right sides, respectively, on the lower half two-row part. Accordingly, a four-series and two-parallel arrangement is realized on the upper half two-row part and a reversely aligned four-series and two-parallel arrangement is realized on the lower half two-row part, and these arrangements are connected in series to each other so that totally an eight-series and two-parallel arrangement is realized. In the embodiment shown in FIG. 31, these arrangements are connected in series to each other by an extended part 24 that is arranged at the midpoint on the right edge.

On the other hand, when the sixteen light emitting elements 1 are mounted in the vertical-alignment orientation as shown in FIG. 33, a sixteen-series arrangement can be realized as shown in FIG. 34. In this case, the sixteen light emitting elements 1 are mounted in a flip chip mounting manner so that the N and P electrodes 3 and 2 are arranged on the upper and lower sides, respectively, in first and third columns. On the other hand, the P and N electrodes 2 and 3 are arranged on the upper and lower sides, respectively, in second and fourth columns. As discussed above, the light emitting elements 1 are alternately rotated by 180° in each row so that sets of two light emitting elements 1 which are connected in series to each other are alternately orientated in a zigzag arrangement on each of the upper half two-row part and the lower half two-row part as shown in FIG. 33, and these arrangement on the upper half two-row part and the lower half two-row part are connected in series to each other by the extended part 24 that is arranged at the midpoint on the right edge. As a result, totally the sixteen light emitting elements 1 are connected in series to each other. Also, in this embodiment, different connection forms, in other words, series-connection and parallel-connection numbers can be selected by changing orientations of the light emitting elements 1 even by using the mount board 10 which has the same wiring pattern 20E. In the mounting positions 21 arranged in the matrix arrangement in the wiring pattern 20E, when the light emitting elements 1 on the upper half two-row part are orientated in one orientation and the light emitting elements 1 on the lower half two-row part are orientated in an orientation opposite to the one orientation in the row direction as shown in FIG. 31 the eight-series and two-parallel arrangement is realized, or when the light emitting elements 1 are alternately rotated in opposite orientations in the column direction in odd numbers of columns and even numbers of columns as shown in FIG. 33 the sixteen-series arrangement is realized, and as a result the eight-series and two-parallel arrangement or the sixteen-series arrangement can be selected.

Second Reflector 50

Parts of the light emitting device 100 are now described in detail with reference to the cross-sectional view of FIG. 2 again. The second reflector 50 is a part which serves to cover the upper surface of the mount board 10 in order to surround the plurality of light emitting elements 1. As shown in the cross-sectional view of FIG. 2, the second reflector 50 has a frame shape. This second reflector 50 can be formed of white resin.

Cover 60

The cover 60 covers the peripheral parts and the upper surface of the light emitting element 1. The space inside the frame-shaped the second reflector 50 is filled with a material of the cover 60 to enclose parts inside the frame-shaped the second reflector 50. The cover 60 contains a resin. Examples of the resin can be provided by phenol resin, epoxy resin, bismaleimide triazine resin, polyphthalamide resin, silicone resin, or the like. In addition, the cover 60 contains the wavelength converter 62 (discussed later in detail) in the resin.

An underfill material can be used together with the cover 60. The underfill material serves to protect the light emitting elements 1, the electrical conductor 29, and like which are arranged on the mount board 10 from dust, moisture, external force, internal stress caused by thermal expansion in accordance with temperature change, and the like. The underfill material can be arranged in a gap between the light emitting elements 1 and the mount board 10. Examples of underfill material can be provided by silicone resin and epoxy resin, for example. In addition to these materials, coloring material, light diffusion material, filler, phosphor, and the like can be added if necessary. In the case in which the underfill material is arranged between the light emitting elements 1 and the mount board 10 as discussed above, light that leaks from the lower-surface side of the light emitting element 1 can be reflected toward the light-emitting-element 1 and the wavelength converter 62. As a result, the light extracting efficiency from the upper surface of the light emitting device can be increased. Also, in the case in which the underfill material contains coloring material, light diffusion material, filler, phosphor, and the like, an effect which reduces light that passes through the cover 60 inside the cover 60 can be enhanced. Therefore, color variation depending on view angle with respect to the light emitting device can be reduced.

Wavelength Converter 62

A phosphor can be suitably used as the wavelength converter 62. As the phosphor, a phosphor represented by the composition formula $(Sr, Ca)AlSiN_3:Eu$, or a phosphor represented by the composition formula $(Ca, Sr, Ba)_2Si_5N_8:Eu$ can be used. Also, $(Ca, Sr, Ba)S:Eu$, $K_2(Si, Ti, Ge)F_6:Mn$, $3.5MgO \cdot 0.5MgF_2 \cdot GeO_2:Mn$, $(Sr, Ca)LiAl_3N_4:Eu$, and the like can be used as phosphors that emits red luminescent radiation. Here, in these composition formulas of phosphors, two or more elements between which the comma (,) is placed mean that at least one of the two or more elements is included and two or more of the two or more elements can be included in their corresponding composition formula except when specified otherwise. Also, in this specification, in these composition formulas of phosphors, elements and numbers before the colon (:) represent the elements and their mole ratios in the base crystal of their corresponding phosphor, and elements after the colon (:) represent an activator element. The term "mole ratios" represent an amount of an element included in one mole of the phosphor.

Also, two or more types of phosphors can be used as the wavelength converter 62. For example, phosphors represented by the composition formulas (Sr, Ca)AlSiN$_3$:Eu (hereinafter, occasionally abbreviated to as "SCASN" in this specification) and (Ca, Sr, Ba)$_2$Si$_5$N$_8$:Eu can be used.

Also, a YAG group phosphor represented by the composition (Lu, Y, Gd, Tb)$_3$(Al, Ga)$_5$O$_{12}$:Ce (hereinafter, occasionally abbreviated as "YAG" in this specification) can be used.

Other examples of available phosphor can be provided by Si$_{6-z}$Al$_z$N$_{8-z}$:Eu (0<z<4.2), Ca$_3$Sc$_2$Si$_3$O$_{12}$:Ce, CaSc$_2$O$_4$:Ce, (La, Y, Gd)$_3$(Al, Si)$_6$N$_{11}$:Ce, (Ca, Sr, Ba)$_8$MgSi$_4$O$_{16}$(F, Cl, Br)$_2$:Eu, (Ca, Sr, Ba)$_3$Si$_6$O$_9$N$_4$:Eu, (Ca, Sr, Ba)$_3$Si$_6$O$_{12}$N$_2$:Eu, (Ba, Sr, Ca)Si$_2$O$_2$N$_2$:Eu, (Ba, Sr, Ca, Mg)$_2$SiO$_4$:Eu, (Ba, Sr, Ca)Ga$_2$S$_4$:Eu, (Ca, Sr, Ba, Mg)$_{10}$(PO$_4$)$_6$(F, Cl, Br, I, OH)$_2$:Eu, (Ba, Sr, Ca)$_3$MgSi$_2$O$_8$:Eu, Sr$_4$Al$_{14}$O$_{25}$:Eu, (Si, Al)$_6$(O, N)$_8$:Eu, and the like.

The wavelength converter 62 is preferably settled in the material of the cover 60. For example, in the production of the light emitting device, after the phosphor is mixed as the wavelength converter 62 into a resin of the cover 60, the space surrounded by the second reflector 50 is filled with the resin so that the phosphor is settled. As a result, the wavelength converter 62 will be formed in a layer structure on the surfaces of the light emitting elements 1 as shown in FIG. 2. Alternatively, the wavelength converter 62 can be uniformly distributed in the cover 60. Such a settled or distributed arrangement of the wavelength converter 62 can be adjusted by adjusting viscosity of the resin of the cover 60, and the like before the resin is cured.

It is noted that the wavelength converter in the embodiment according to the present invention is not limited to a phosphor which is mixed in the cover 60, but the wavelength converter can be a plate-shaped phosphor film formed of resin used together with a light-transmissive part such as glass, for example. Also, the wavelength converter can be phosphor ceramic which is formed by sintering a mixture of a phosphor and ceramic, a phosphor sheet which is formed of a sheet-shape resin in which a phosphor is mixed, glass which contains a phosphor, and the like.

Protection Element 70

In addition, the light emitting device 100 includes a protection element 70 on a part of the wiring pattern 20. The protection element 70 serves to protect the light emitting elements 1 from static damage or high-voltage surge. Specifically, a Zener diode can be used as the protection element. The protection element 70 can be covered with a light reflection material such as white resin (second reflector 50) in order to reduce light absorption. In the examples shown in FIGS. 6 and 8, an upper surface of the protection element 70 is electrically connected to the wiring pattern 20 through wire 49.

Because connection forms of series connection and/or parallel connection can be changed by using the mount board 10 having the common wiring pattern 20 as discussed above, it is not necessary to prepare mount boards having different wiring patterns depending on connection forms. Also, because additional wiring pattern lines which extend between columns of light emitting element, the columns of light emitting element can be arranged close to each other. As a result, the light emitting device can emit light having a lighting pattern close to a point source of light. In addition, because the light emitting elements 1 are mounted on the wiring pattern 20 in a flip chip mounting manner and connected in series and/or parallel to each other without using bonding wire, light absorption by such wire can be prevented.

A light emitting device according to the present invention can be used as so-called COB for lighting apparatus, spotlight, headlight, back light source for liquid crystal display, large size display, and various types of displays for advertisement, information sign, etc., as well as image scanner for digital video camera, facsimile, copier, scanner, etc., projector, and the like.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

What is claimed is:

1. A light emitting device comprising:
   a mount board that includes a wiring pattern including mounting positions on an upper surface of the mount board, each mounting position of the mounting positions includes four or more connection terminals that are electrically separated from each other; and
   a plurality of light emitting elements that include a pair of electrodes connected to each other by the four or more connection terminals on a back surface side, and are mounted at a corresponding one of mounting positions on the wiring pattern to be connected in series and/or in parallel to each other through the wiring pattern, a number of the light emitting elements that are connected in series to each other and a number of the light emitting elements that are connected in parallel to each other being determined in accordance with orientations of the light emitting elements in which each electrode straddles at least adjacent two of the four or more connection terminals that are spaced away from and adjacent to each other.

2. The light emitting device according to claim 1, wherein at least one of the four or more connection terminals that are included in one of the mounting positions that are adjacent to each other is electrically connected to at least one of the four or more connection terminals that are included in another adjacent mounting position in the wiring pattern.

3. The light emitting device according to claim 2,
   wherein an extended part is arranged between the mounting positions that are adjacent to each other in the wiring pattern to connect the connection terminal that is included in one adjacent mounting position to the connection terminal that is included in another adjacent mounting position, and
   wherein the extended part has a width smaller than the connection terminal.

4. The light emitting device according to claim 3,
   wherein the pair of electrodes have an elongated shape that extends one direction, and
   wherein the plurality of light emitting elements are connected in series and in parallel to each other by each electrode in the pair of electrodes that electrically connects the at least adjacent two connection terminals to each other when the light emitting elements are mounted at the mounting positions.

5. The light emitting device according to claim 3, wherein the number of the light emitting elements that are connected in series to each other and the number of the light emitting elements that are connected in parallel to each other are changed in accordance with orientations that are changed from one to another by rotating the light emitting elements by 90°.

6. The light emitting device according to claim 3,
wherein the light emitting elements have a substantially square shape,
wherein the pair of electrodes extend along two opposed sides of the square shape,
wherein the mounting positions have a substantially square shape corresponding the square shape of the light emitting element, and
wherein the four or more connection terminals are four connection terminals that are arranged in four corners of the square shape in their corresponding mounting position to be spaced away from each other.

7. The light emitting device according to claim 3, wherein the plurality of mounting positions in the wiring pattern are arranged in a matrix arrangement.

8. The light emitting device according to claim 7, wherein at least one of the four or more connection terminals in the mounting positions that are located in the corners of the matrix arrangement is not connected to any connection terminal.

9. The light emitting device according to claim 3,
wherein the plurality of light emitting elements include first, second, third and fourth light emitting elements,
wherein the plurality of mounting positions include
a first mounting position at which the first light emitting element is mounted,
a second mounting position at which the second light emitting element is mounted,
a third mounting position at which the third light emitting element is mounted, and
a fourth mounting position at which the fourth light emitting element is mounted,
wherein first, second, third and fourth connection terminals for the first light emitting element are arranged in the first mounting position,
wherein first, second, third and fourth connection terminals for the second light emitting element are arranged in the second mounting position,
wherein first, second, third and fourth connection terminals for the third light emitting element are arranged in the third mounting position, and
wherein first, second, third and fourth connection terminals for the fourth light emitting element are arranged in the fourth mounting position,
wherein first, second, and third extended parts are arranged as the extended part,
wherein the first connection terminal for the first light emitting element is connected to an external connection terminal,
wherein the third connection terminal for the first light emitting element and the fourth connection terminal for the first light emitting element are connected to the first connection terminal for the second light emitting element and the second connection terminal for the second light emitting element, respectively, through their corresponding first extended part,
wherein the fourth connection terminal for the second light emitting element is connected to the third connection terminal for the third light emitting element through the second extended part,
wherein the first connection terminal for the third light emitting element and the second connection terminal for the third light emitting element are connected to the third connection terminal for the fourth light emitting element and the fourth connection terminal for the fourth light emitting element, respectively, through their corresponding third extended part, and
wherein the second connection terminal for the fourth light emitting element is connected to an external connection terminal or another connection terminal that is adjacent to the second connection terminal for the fourth light emitting element.

10. The light emitting device according to claim 9, wherein the second connection terminal for the first light emitting element, the third connection terminal for the second light emitting element, the fourth connection terminal for the third light emitting element, and the first connection terminal for the fourth light emitting element are isolated so as not to be connected to any connection terminal.

11. The light emitting device according to claim 9,
wherein the wiring pattern further includes a fifth mounting position between the first and second mounting positions, and a sixth mounting position between the third and fourth mounting positions, and
wherein the plurality of light emitting elements further include fifth and sixth light emitting elements that are mounted in the fifth and sixth mounting positions, respectively.

12. The light emitting device according to claim 1, wherein the connection terminals on the mount board are not externally exposed when the light emitting elements are mounted at the mounting positions.

13. The light emitting device according to claim 1, further comprising a first reflector that covers areas on the mount board other than the wiring pattern.

* * * * *